(12) United States Patent
Yoshida et al.

(10) Patent No.: US 11,867,390 B2
(45) Date of Patent: Jan. 9, 2024

(54) LIGHT SOURCE DEVICE

(71) Applicant: NICHIA CORPORATION, Anan (JP)

(72) Inventors: Norimasa Yoshida, Komatsushima (JP);
Tsuyoshi Okahisa, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 17/731,945

(22) Filed: Apr. 28, 2022

(65) Prior Publication Data

US 2022/0252238 A1 Aug. 11, 2022

Related U.S. Application Data

(63) Continuation of application No. PCT/JP2020/034187, filed on Sep. 9, 2020.

(30) Foreign Application Priority Data

Oct. 30, 2019 (JP) .................................. 2019-197985

(51) Int. Cl.
*F21V 5/04* (2006.01)
*F21V 5/00* (2018.01)

(52) U.S. Cl.
CPC .............. *F21V 5/045* (2013.01); *F21V 5/008* (2013.01)

(58) Field of Classification Search
CPC .................................. F21V 5/045; F21V 5/008
See application file for complete search history.

(56) References Cited

U.S. PATENT DOCUMENTS

| | | | |
|---|---|---|---|
| 7,580,192 B1 | 8/2009 | Chu et al. | |
| 10,190,746 B1 | 1/2019 | Mao et al. | |
| 2002/0036839 A1 | 3/2002 | Kishima et al. | |
| 2007/0263390 A1* | 11/2007 | Timinger | ............... F21V 7/0091 |
| | | | 362/308 |
| 2008/0037116 A1 | 2/2008 | Alasaarela et al. | |
| 2010/0232176 A1 | 9/2010 | Alasaarela et al. | |
| 2012/0063146 A1 | 3/2012 | Kawagoe et al. | |
| 2013/0001605 A1* | 1/2013 | Ishihara | ................... H01L 33/56 |
| | | | 257/E33.061 |

(Continued)

FOREIGN PATENT DOCUMENTS

| | | |
|---|---|---|
| CN | 108397750 A | 8/2018 |
| JP | S63-106738 A | 5/1988 |

(Continued)

OTHER PUBLICATIONS

International Search Report with English Translation and Written Opinion dated Oct. 20, 2020 corresponding International Application No. PCT/JP2020/034187; 12 pages.

*Primary Examiner* — Andrew J Coughlin
(74) *Attorney, Agent, or Firm* — Foley & Lardner LLP

(57) ABSTRACT

A light source device includes: a plurality of independently operable light emitting devices; a first lens facing the light emitting devices; and a second lens facing the first lens. A lower face of the first lens facing the light emitting devices includes: an entrance part located in a center where light from the light emitting devices enters, and a light guide part located outward of the entrance part and configured to guide light entering the entrance part. A lower face of the second lens facing the first lens includes a Fresnel lens face including a plurality of annular protruding portions.

19 Claims, 23 Drawing Sheets

(56) References Cited

U.S. PATENT DOCUMENTS

| | | |
|---|---|---|
| 2014/0316742 A1 | 10/2014 | Sun et al. |
| 2015/0316228 A1* | 11/2015 | Saito .................. F21V 17/08 362/311.06 |
| 2016/0072996 A1 | 3/2016 | Rammah et al. |
| 2016/0230953 A1* | 8/2016 | Wang .................. F21V 5/008 |
| 2017/0002997 A1* | 1/2017 | Huang .................. F21V 5/008 |
| 2018/0112848 A1 | 4/2018 | Streppel |
| 2018/0187841 A1 | 7/2018 | Nakamura |
| 2019/0280174 A1 | 9/2019 | Okahisa et al. |
| 2020/0089059 A1 | 3/2020 | Nakamura |
| 2020/0271297 A1 | 8/2020 | Streppel |

FOREIGN PATENT DOCUMENTS

| | | |
|---|---|---|
| JP | 2002-072037 A | 3/2002 |
| JP | 2004-046053 A | 2/2004 |
| JP | 2010-238837 A | 10/2010 |
| JP | 2011-096666 A | 5/2011 |
| JP | 2011-184468 A | 9/2011 |
| JP | 2012-049214 A | 3/2012 |
| JP | 2012-104256 A | 5/2012 |
| JP | 2012-174601 A | 9/2012 |
| JP | 2014-182994 A | 9/2014 |
| JP | 2015-507817 A | 3/2015 |
| JP | 2015-195170 A | 11/2015 |
| JP | 2017-016995 A | 1/2017 |
| JP | 2017-103051 A | 6/2017 |
| JP | 2018-098162 A | 6/2018 |
| JP | 2018-152402 A | 9/2018 |
| JP | 2018-205349 A | 12/2018 |
| JP | 2019-160780 A | 9/2019 |
| WO | WO-2006/072885 A1 | 7/2006 |
| WO | WO-2011/055519 A1 | 5/2011 |
| WO | WO-2013/065408 A1 | 5/2013 |
| WO | WO-2017/202670 A1 | 11/2017 |

* cited by examiner

LIGHT SOURCE DEVICE

CROSS-REFERENCE TO RELATED APPLICATION

This is a bypass continuation of PCT Application No. PCT/JP2020/034187, filed on Sep. 9, 2020, which claims priority to Japanese Patent Application No. 2019-197985, filed on Oct. 30, 2019. The contents of these applications are hereby incorporated by reference in their entireties.

BACKGROUND

The present disclosure relates to a light source device.

Light sources using light emitting devices such as light emitting diodes are widely used. For example, Japanese Patent Publication No. 2010-238837 A discloses a small light source device that can be used as a flashlight in a cellular phone.

SUMMARY

One object of certain embodiments of the present disclosure is to provide a light source device capable of selectively irradiating light in a desired direction.

According to one embodiment, a light source device includes a plurality of independently operable light emitting devices, a first lens disposed to face the light emitting devices, and a second lens disposed to face the first lens A lower face of the first lens facing the light emitting devices includes an entrance part provided in a center where light from the light emitting devices enters, and the lower face of the first lens 11 including a light guide part provided on an outside of the entrance part to guide the light entering the entrance part. A lower face of the second lens facing the first lens includes a Fresnel lens face composed of a plurality of annular protruding portions.

According to another embodiment, a light source device includes a plurality of independently operable light emitting devices and a first lens disposed to face the light emitting devices. A lower face of the first lens facing the light emitting devices include an entrance part provided in a center of the lower face where light from the light emitting devices enters, and the lower face of the first lens including a light guide part provided on the outside of the entrance part to guide light entering the entrance part. An upper face of the first lens opposite to the lower face includes a Fresnel lens face composed of a plurality of annular protruding portions.

According to certain embodiments of the present disclosure, a light source device capable of selectively irradiating light in a desired direction can be provided.

DETAILED DESCRIPTION

Figure 1:
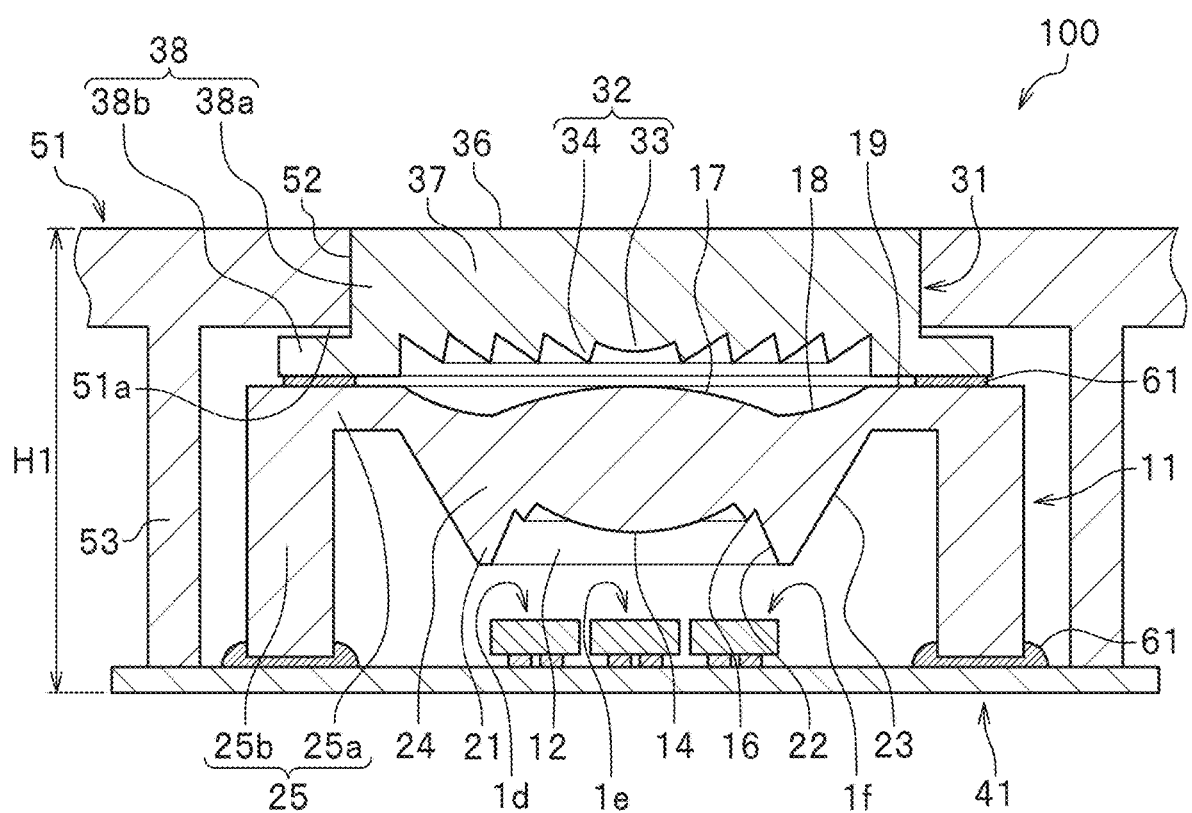
FIG. 1 is a cross-sectional view schematically showing the structure of a light source device according to a first embodiment.

Light source devices according to certain embodiments of the present invention will be explained with reference to the accompanying drawings. The embodiments described below, however, are examples for the purpose of giving shape to the technical ideas of the embodiments and are not intended to limit the present invention. Furthermore, the sizes, materials, shapes, and the relative positions of the constituent parts described in the embodiments are merely provided as explanatory examples, without any intention of limiting the scope of the present invention unless otherwise specifically noted. The sizes of and the positional relationship between the members shown in each drawing may be exaggerated for clarity of explanation. In the description below, the same designations and reference numerals denote the same or similar members, for which repeated detailed explanation will be omitted as appropriate.

First Embodiment

Figure 3:
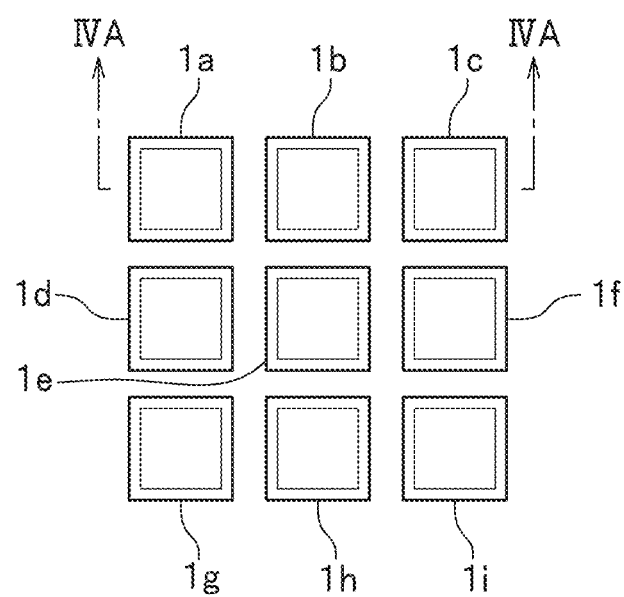
FIG. 3 is a plan view showing the layout of the light emitting devices in the light source device according to the first embodiment.

A light source device 100 according to a first embodiment, as shown in FIG. 1 and FIG. 3, includes a plurality independently operable light emitting devices 1a to 1i, a first lens 11 disposed to face the light emitting devices 1a to 1i, and a second lens 31 disposed to face the first lens 11. The lower face of the first lens 11 facing the light emitting devices 1a to 1i includes an entrance part provided in the center where light from the light emitting devices 1a to 1i enters. The lower face of the first lens 11 including a light guide part 21 provided on the outside of the entrance part 12 to guide light entering the entrance part 12. The lower face of the second lens 31 facing the first lens 11 includes a Fresnel lens face 32 composed of a plurality of annular protruding portions 34.

The light source device 100 may further include a substrate 41 on which the light emitting devices 1a to 1i are mounted, and a housing 51 defining an opening 52 that faces the second lens 31. The first lens 11 is preferably fixed to the substrate 41. Furthermore, in the light source device 100, the second lens 31 is preferably fixed to the first lens 11 that is fixed to the substrate 41. Constituent elements of the light source device will be explained below.

Light Emitting Device

A plurality of independently operable light emitting devices 1a to 1i, are mounted on a substrate 41. As shown in FIG. 3, the light emitting devices 1a to 1i are preferably collectively arranged in a quadrangle in a plan view. The light emitting devices 1a to 1i are more preferably arranged in a square or rectangular lattice having at least two rows and two columns. For example, it is preferable to regularly collectively arrange four or nine light emitting devices vertically and laterally at equal intervals into a quadrangle in a plan view.

Figure 4A:
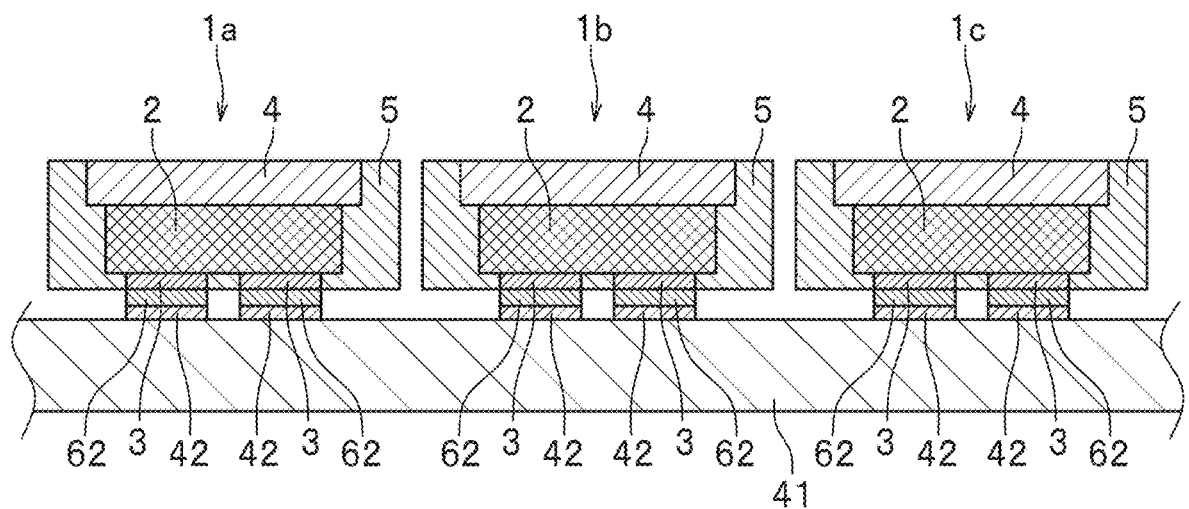
FIG. 4A is a cross-sectional view taken along line IVA-IVA in FIG. 3.
Figure 4B:
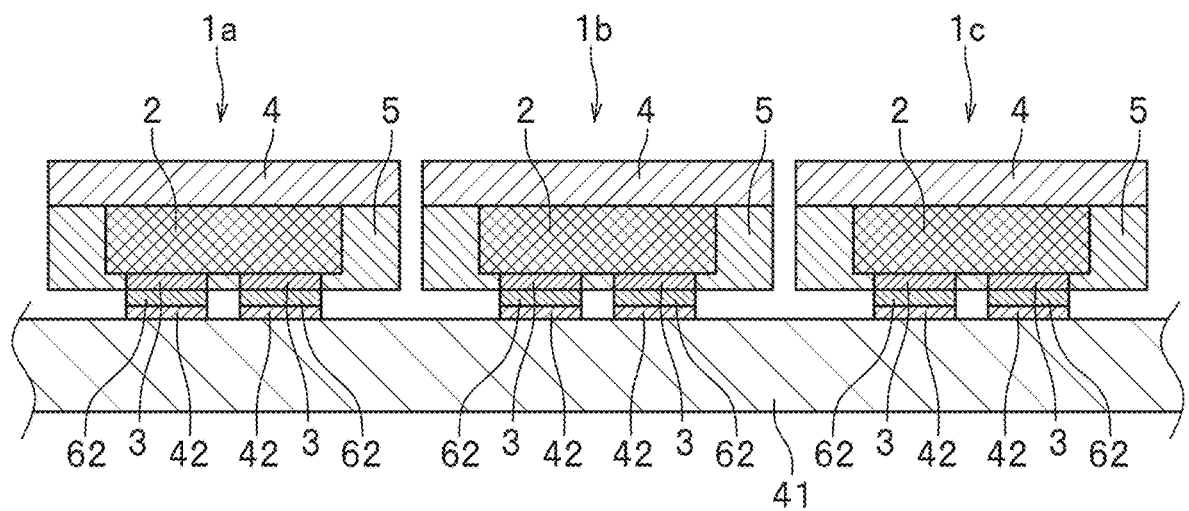
FIG. 4B is a cross-sectional view schematically showing another structure of a light emitting device in the light source device according to the first embodiment.

As shown in FIG. 4A, the light emitting device 1a having an upper face as the emission face is mounted on the substrate 41 using the lower face opposite to the upper face as the mounting face. The light emitting device 1a includes a light emitting element 2, a light transmissive member 4 disposed on the upper face of the light emitting element 2, and a cover member 5 covering the lateral faces of the light emitting element 2 and the lateral faces of the light transmissive member 4 without covering the upper face of the light transmissive member 4. As shown in FIG. 4B, the lateral faces of the light transmissive member 4 can be exposed from the cover member 5. Positive and negative electrodes 3 are preferably disposed on the lower face of the light emitting element 2 opposite to the upper face. Moreover, the shape of the light emitting device 1a in a plan view, for example, is a quadrangle, but may alternatively be a circle, ellipse, or polygon, such as a triangle, hexagon, or the like. The light emitting devices 1b to 1i are constructed in the same manner as in the light emitting device 1a. Alternatively, a single light emitting device equipped with a plurality of light emitting elements 2, instead of a plurality of light emitting devices, may be mounted on the substrate 41. For example, a plurality of light emitting elements 2 each equipped with a light transmissive member 4 may be regularly arranged vertically and laterally at equal intervals and integrated by a cover member 5 as a single light emitting device. In this case also, the light emitting elements 2 are mounted on a substrate 41 so as to be independently operable.

A light emitting elements 2 is preferably made of various semiconductors, such as group III-V compound semiconductors, II-VI compound semiconductors, or the like. For semiconductors, nitride-based semiconductors such as $In_xAl_yGa_{1-x-y}N$ ($0 \leq X$, $0 \leq Y$, $X+Y \leq 1$) are preferably used, and InN, AlN, GaN, InGaN, AlGaN, InGaAlN, or the like can also be used.

A light transmissive member 4 is a sheet-shaped member having a quadrilateral shape in a plan view and is disposed to cover the upper face of a light emitting element 2. The light transmissive member 4 can be formed by using a light transmissive resin material, an inorganic material such as a ceramic, glass, or the like. For resin materials, thermosetting resins, such as silicone resins, silicone modified resins, epoxy resins, phenol resins or the like can be used. Moreover, thermoplastic resins, such as polycarbonate resins, acrylic resins, methylpentane resins, polynorbornene resins or the like can also be used. Particularly, highly light resistant and heat resistant silicone resins or silicone modified resins are suited. Light transmissivity here refers to the property of transmitting at least 60% of the light from a light emitting element 2. Furthermore, the light transmissive member 4 may contain a light diffuser and/or a phosphor that converts the wavelength of at least a portion of the light emitted from the light emitting element 2. Examples of a light transmissive member 4 containing a phosphor include the aforementioned resins, ceramics, glass, or the like, that contain a phosphor, a sintered body of a phosphor, and the like. The light transmissive member 4 may be one having a resin layer containing a phosphor and/or a light diffuser formed on the lower face of a formed body of a resin, glass, ceramic, or the like.

For example, by employing a blue light emitting element as the light emitting element 2 and a light transmissive member 4 containing a yellow-emitting phosphor, a light emitting device 1 that emits white light can be obtained.

Examples of phosphors to be contained in the light transmissive member 4 include yellow phosphors, such as YAG phosphors exemplified by $Y_3Al_5O_{12}$:Ce, silicate, and the like, and red phosphors such as CASN phosphors exemplified by $CaAlSiN_3$:Eu, KSF phosphors exemplified by $K_2SiF_6$:Mn, and the like.

For the light diffuser to be contained in the light transmissive member 4, for example, titanium oxide, barium titanate, aluminum oxide, silicon oxide, or the like can be used.

A cover member 5 covers the lateral faces of the light emitting element 2 and the light transmissive member 4 directly or indirectly. The upper face of the light transmissive member 4 exposed from the cover member 5 constitutes the emission face, i.e., the primary light extraction face, of a light emitting device 1. The cover member 5 is preferably composed of a highly reflective material in order to increase the light extraction efficiency. For the cover member 5, for example, a resin material containing a light reflecting substance such as a white pigment can be used. Examples of light reflecting substances include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, silicon oxide, and the like. It is preferable to use one of these singly or in combination of two or more. A resin material preferably has the base material employing as a primary component a thermosetting resin, such as an epoxy resin, silicone resin, silicone modified resin, phenol resin, or the like.

The cover member 5 may be composed of a material that transmits visible light as needed.

First Lens

A first lens 11 is disposed to face the light emitting devices 1a to 1i. The first lens 11 collects the light from the light emitting devices 1a to 1i and allows the light to exit towards the second lens 31. An example of the first lens 11 is a collimating lens. The first lens 11 is preferably formed with a transparent resin such as a polycarbonate resin, acrylic resin, silicone resin, epoxy resin, or the like. The plan view shape of the first lens 11 is preferably circular or elliptical, but may be polygonal, such as a square, hexagon, or the like.

The first lens 11 includes, in the lower face facing the light emitting devices 1a to 1i, an entrance part 12 provided in the center where the light from the light emitting devices 1a to 1i enter, and a light guide part 21 provided concentrically around the entrance part 12 to guide the light entering the entrance part 12. Moreover, in the case of using the light emitting device 100 as a light source for the flashlight in a cellular phone, the lower face of the first lens 11 in a plan view is preferably shaped to have four-fold rotational symmetry, considering that a general imaging range of a camera is rectangular. The lower face of the first lens 11 may be shaped to have two-fold rotational symmetry in a plan view.

An entrance part 12 is a concave portion of the lower face of the first lens 11 sized to enclose the light emitting devices 1a to 1i in a plan view. The plan view shape of the bottom face of the concave entrance part 12 is preferably quadrangular, but may alternatively be circular, elliptical, triangular, quadrangular, hexagonal, or the like. Here, the bottom face of the concave portion is preferably formed as a Fresnel lens face. In other words, the entrance part 12 preferably includes a lower face convex portion 14 provided in the center and protruding towards the light emitting devices 1a to 1i, and an angular portion 16 concentrically provided around the lower face convex portion 14 and protruding towards the light emitting devices 1a to 1i. Furthermore, the angular portion 16 is preferably provided concentrically around the lower face convex portion 14 continuously or intermittently. The angular portion 16 here is concentrically formed to go around once, but may be formed to go around multiple times. The angular portion 16 can reduce the radius of the lower face convex portion 14, capturing more light from the light emitting devices 1a to 1i to thereby improve the light collecting performance. The inner lateral face 22 of the concave portion is preferably a flat face, but may be a curved face.

A light guide part 21 is provided on the outside of the entrance part 12 on the lower face side of the first lens 11. The light guide part 21 has an oblique face 23 to reflect the light entering the entrance part 12. The light guide part 21 preferably has an annular shape continuously or intermittently formed concentrically around the entrance part 12. This allows the light guide part 21 to collect the portion of the light emitted from the light emitting devices 1a to 1i having a large angle of emergence and advancing out of a desired irradiation range, thereby improving the light extraction efficiency. The angle of inclination of the oblique face 23 relative to the optical axis is suitably set to allow the oblique face to collect and reflect the light emitted from the light emitting devices 1a to 1i.

The upper face of the first lens 11 preferably has an upper face convex portion 17 provided in the center and protruding towards the second lens 31, an upper face concave portion 18 that is contiguous with the upper face convex portion 17, and a flat portion 19 provided around the upper face convex portion 17 via the upper face concave portion 18. The upper face concave portion 18 preferably has an annular concave face formed concentrically around the upper face convex portion 17. The upper face convex portion 17 is preferably formed larger than the lower face convex portion 14 in a plan view. The first lens 11 having the upper face convex portion 17 can facilitate extraction of the light entering the lower face convex portion 14 and/or the angular portion 16 of the entrance part 12 towards the second lens. Moreover, the first lens 11 having the upper face concave portion 18 can facilitate extraction of the light reflected by the oblique face 23 towards the second lens. Having the upper face concave portion 18 allows the inclination angle of the oblique face 23 relative to the optical axis to be reduced. This can also reduce the lens diameter of the first lens 11, which in turn can reduce the lens diameter of the second lens 31. This in turn can reduce the diameter of the opening 52 of the housing 51. Accordingly, the interior is less visible through the opening 52 to thereby improve the external appearance quality.

Figure 5:
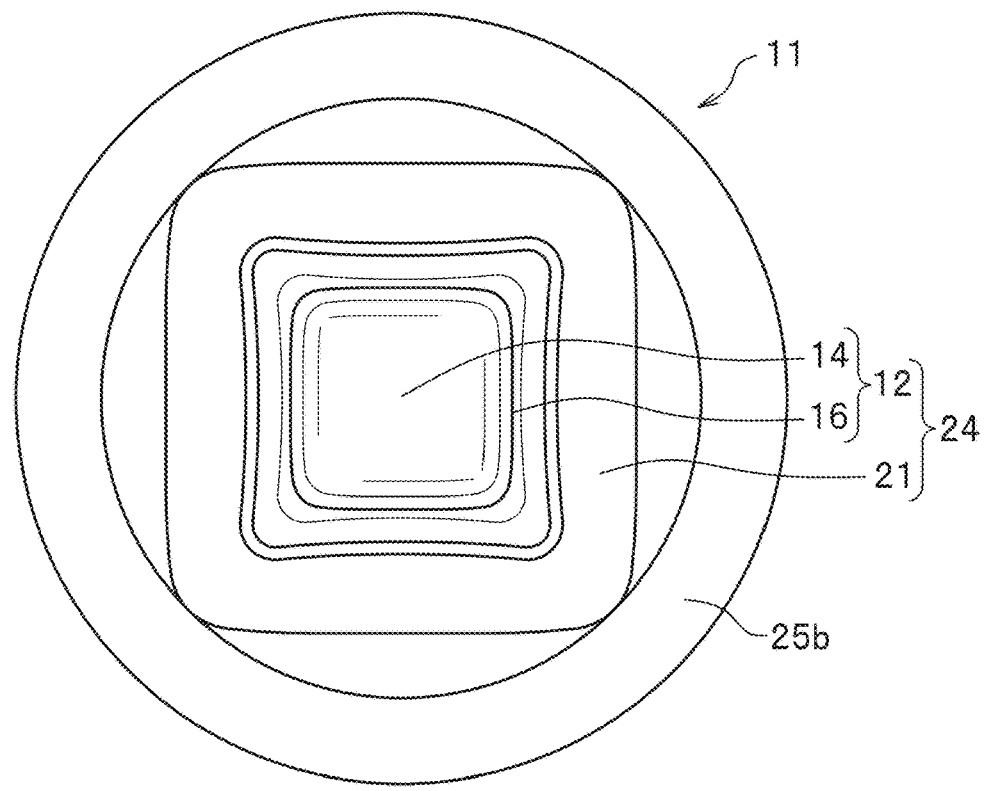
FIG. 5 is a plan view of a first lens in the light source device according to the first embodiment when viewed from the light emitting device side.

The first lens 11, as shown in FIG. 5, includes a first main body 24 that has the entrance part 12 and the light guide part 21, and a first marginal part 25 extending laterally from the periphery of the first main body 24. The first marginal part 25 preferably includes a first upper portion 25a and a first leg portion 25b extending from the first upper portion 25a towards the substrate 41. The first marginal part 25 is formed so as to extend laterally from the periphery of the first main body 24 and have an annular shape surrounding the first main body 24. The first upper portion 25a is formed to have a flat top and the same height as the upper end of the upper face convex portion 17 of the first main body 24. The first leg portion 25b, as one example, has a tubular shape contiguous in the lateral direction with the first upper portion 25a. This allows the first lens 11 to have the lower face of the first leg portion 25b of the first marginal part 25 fixed to the upper face of the substrate 41 via an adhesive material 61, while fixing the upper face of the first upper portion 25a of the first marginal part 25 to the lower face of the second lens 31 via an adhesive material 61. Here, any known bonding material such as adhesive tape can be used as the adhesive material 61. As one example, the first main body 24 and the first marginal part 25 of the first lens 11 are integrally formed by processing a single material. The first main body 24 and the first marginal part 25 may be formed with different materials; for example, the first main body 24 can be formed with a resin or glass material that transmits light, and the first marginal part 25 can be formed with a metal such as an aluminum alloy or the like.

Second Lens

A second lens 31 is disposed to face the first lens 11 to refract the light from the first lens 11 to exit in a desired irradiation range. The second lens 31, similar to the first lens 11, is preferably formed with a light transmissive resin, such as a polycarbonate resin, acrylic resin, silicone resin, epoxy resin, or the like. The outer shape of the second lens 31 is preferably circular or elliptical in a plan view, but may be polygonal, such as a quadrangle, hexagon, or the like.

The second lens 31 is preferably a Fresnel lens having protruding or indented portions. The lower face of the second lens 31 facing the first lens 11 includes a Fresnel lens face 32 composed of a plurality of annular protruding portions 34. The Fresnel lens face 32 includes a central convex portion 33 protruding towards the first lens 11, and a plurality of annular protruding portions 34 concentrically provided around the central convex portion 33 and protruding towards the first lens 11. The annular convex portions 34 are preferably formed concentrically with the central convex portion 33 in a plan view and annularly along the shape of the central convex portion 33. In other words, the protruding portions 34 are formed into an annular shape in a plan view if the central convex portion 33 is circular in a plan view, and into a rectangular annular shape in a plan view if the central convex portion 33 is a rectangular in a plan view. The Fresnel lens face 32 is preferably sized to enclose the entrance part 12 and the light guide part 21 of the first lens 11 in a plan view.

Figure 6:
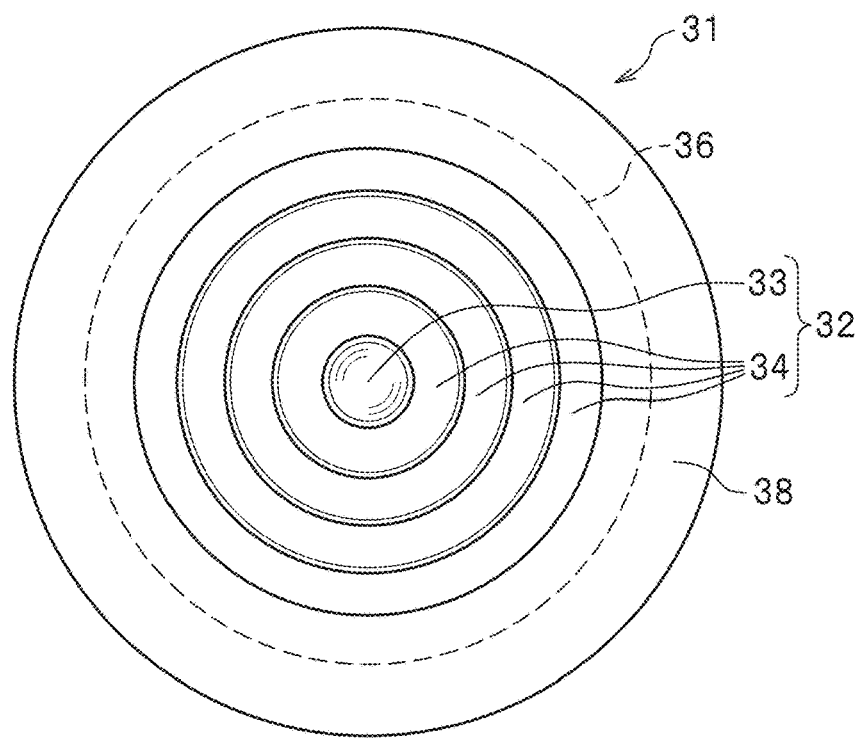
FIG. 6 is a plan view of a second lens in the light source device according to the first embodiment when viewed from the first lens side.

The second lens 31 preferably includes, in addition to the Fresnel lens face 32 on the first lens side, a second main body 37 having a flat face 36 that is located at the opposite side to the Fresnel lens face 32 and faces the opening 52 of a housing 51, and a second marginal part 38 extending laterally from the periphery of the second main body 37 as shown in FIG. 1 and FIG. 6. The second marginal part 38 preferably includes a second leg portion 38a extending from the periphery of the second main body 37 towards the first lens 11 and a second attaching portion 38b extending laterally from and contiguous with the lower end of the second leg portion 38a. The flat face 36 is formed to have at least the same size as that of the Fresnel lens face 32 in a plan view, and the same height as the upper face of the housing 51 when the second main body 37 is inserted into the opening 52 of the housing 51. The surface of the flat face 36 of the second lens 31 may be subjected to surface texturing or provided with micro protrusions and depressions.

Figure 2:
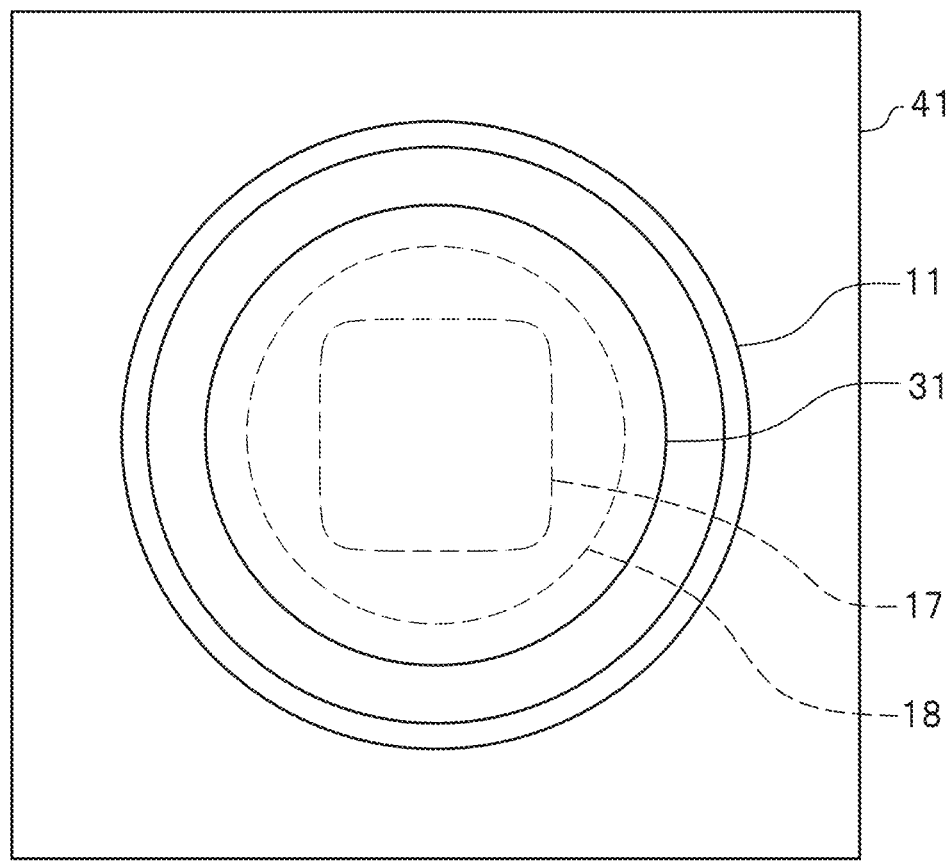
FIG. 2 is a plan view of the light source device according to the first embodiment, in which no housing is shown, when viewed from the second lens side.

The second marginal part 38 is formed to extend from the second main body 37 and be annular such that the upper face is coplanar with the flat face 36. The second leg portion 38a is formed such that the lower end face is positioned lower than the lower face of the Fresnel lens face 32. The second attaching portion 38b is formed to laterally extend from the lower lateral face of the second leg portion 38a and be annular. The second attaching portion 38b is formed such that the lower end is flat and coplanar with the lower end of the second leg portion 38a. The second attaching portion 38b is preferably arranged to face the first upper portion 25a of the first lens 11. This allows the upper face of the first marginal part 25 to be fixed to the lower face of the second marginal part 38 via an adhesive material 61. The second leg portion 38a of the second lens 31 is formed more closely to the center than the first upper portion 25a of the first lens 11. In other words, as shown in FIG. 2, the second lens 31 is fixed so as to be enclosed by the first lens 11 in a plan view.

By positioning the lower face of the second leg portion 38a of the second lens 31 lower than the Fresnel lens face 32, the two lenses can be arranged such that the first main body 24 of the first lens 11 and the second main body 37 of the second lens 31 are spaced apart. This can reduce the interference between the first lens 11 and the second lens 31.

Furthermore, the second lens 31 is preferably inserted into the opening 52 of the housing 51 while exposing the flat face 36 of the second main body 37 and bringing the outer circumferential surface of the second leg portion 38a into contact with the inner circumferential surface of the opening 52. Furthermore, in the light source device 100, the lower face of the second marginal part 38 of the second lens 31 is preferably fixed to the upper face of the first marginal part 25 of the first lens 11 via an adhesive material 61.

Substrate

A substrate 41 on which a plurality of light emitting devices 1a to 1i is mounted preferably includes wiring 42 disposed on the surface and/or inside thereof. The substrate 41 is electrically connected to the light emitting devices 1a to 1i when the wiring 42 is connected to the positive and negative electrodes 3 of the light emitting devices 1a to 1i via a conductive adhesive material 62. The structure, size, and the like of the wiring 42 of the substrate 41 are set in conformance with the structure and size of the electrodes 3 of the light emitting devices 1a to 1i.

For the substrate 41, it is preferable to use an insulating material that is less likely transmits the light emitted from the light emitting devices 1a to 1i or the light from the outside while having a certain degree of strength. Specifically, the substrate 41 can be structured with a ceramic material, such as alumina, aluminum nitride, mullite, or the like, or a resin material, such as a phenol resin, epoxy resin, polyimide resin, BT (bismaleimide triazine) resin, polyphthalamide, or the like.

Wiring 42 can be formed using copper, iron, nickel, tungsten, chromium, aluminum, silver, gold, titanium, palladium, rhodium, or an alloy of these. Furthermore, for the outer layer of the wiring 42, a layer of silver, platinum, aluminum, rhodium, gold, or an alloy of these may be disposed from the perspective of the wettability and/or the reflectivity of the conductive adhesive material 62.

Housing

A housing 51 covers the lenses defining an opening 52 that faces the second lens 31, and may be, for example, a portion of the housing of a cellular phone in which the light source device 100 is used as the light source for the flashlight. The opening 52 is preferably larger in size than the second main body 37 of the second lens 31 to expose the flat face 36 of the second main body 37. The housing 51 may include a leg portion 53 to be fixed to the substrate 41. The housing 51 is preferably formed of a light shielding material, for example, preferably structured using a resin material containing a filler, such as a light reflecting material, light absorbing material, or the like, so as to restrict the light distribution directions of the light exiting from the light source device 100. Examples of the plan view shape of the opening 52 include a circle, ellipse, triangle, square, hexagon, and the like.

By combining the first lens 11 and the second lens 31, the light source device 100 can irradiate light in a desired direction corresponding to the locations of the light emitting devices 1a to 1i that are lit.

Figure 7A:
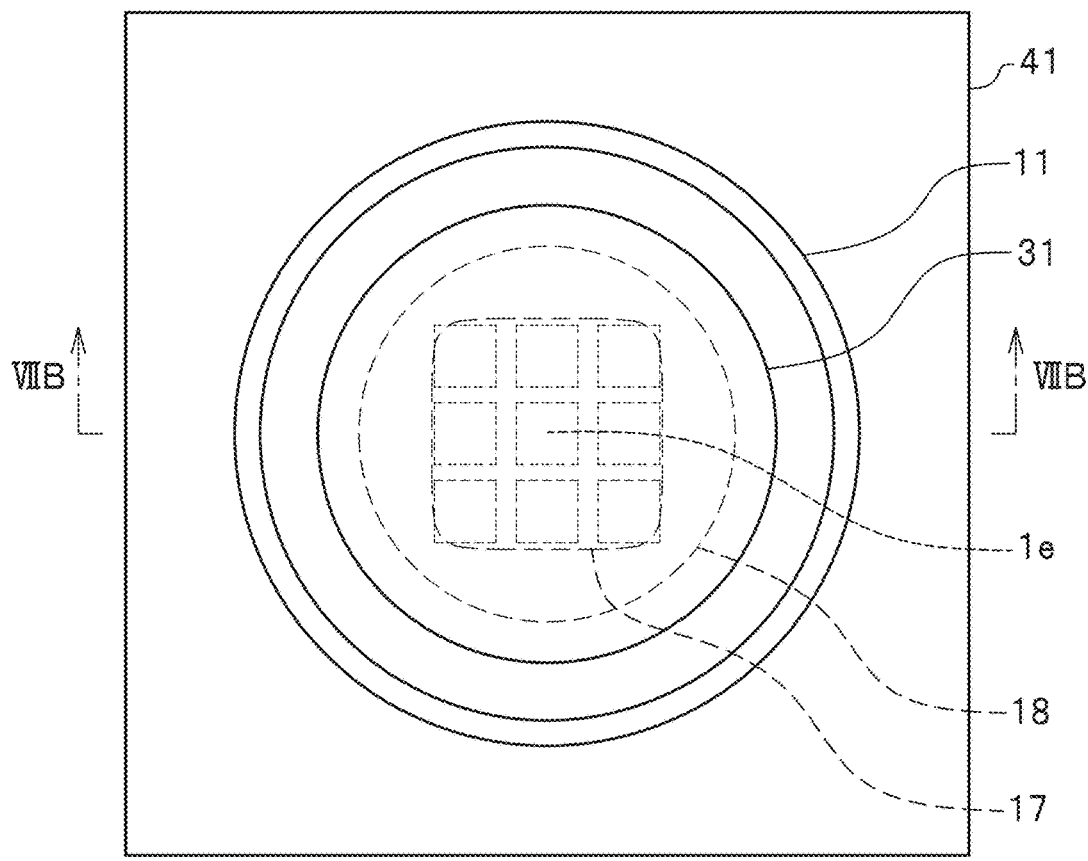
FIG. 7A is a plan view showing the positional relationship between the light emitting device 1$e$ located in the center that is lit and the first and second lenses in the light source device according to the first embodiment, in which no housing is shown, when viewed from the second lens side.
Figure 7B:
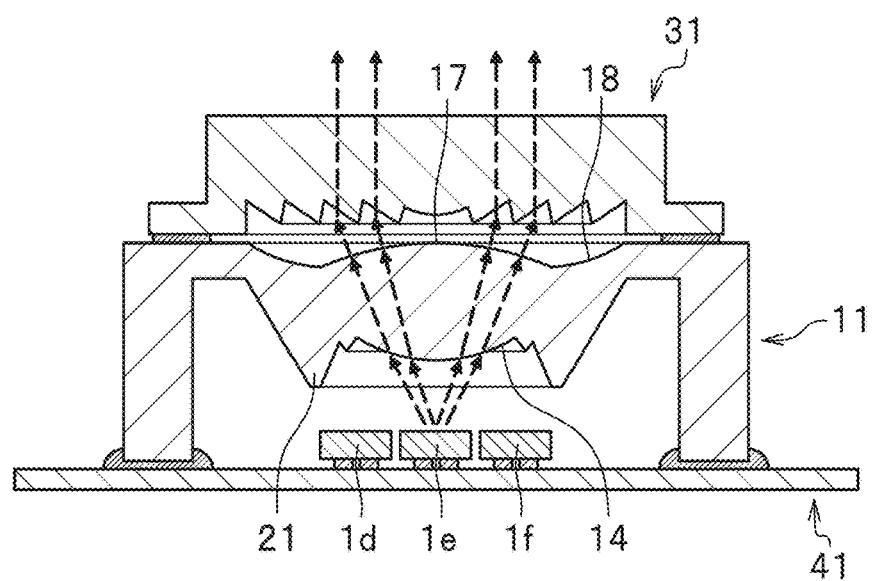
FIG. 7B is a cross-sectional view schematically showing the light paths of the light source device shown in FIG. 7A.
Figure 7C:
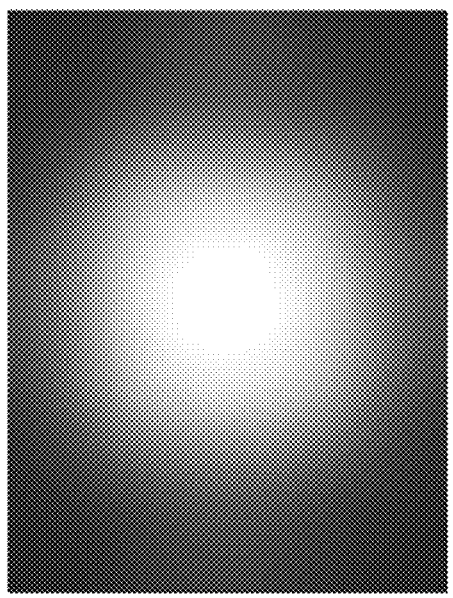
FIG. 7C is a schematic diagram showing the illuminance distribution in the light source device shown in FIG. 7B.
Figure 8A:
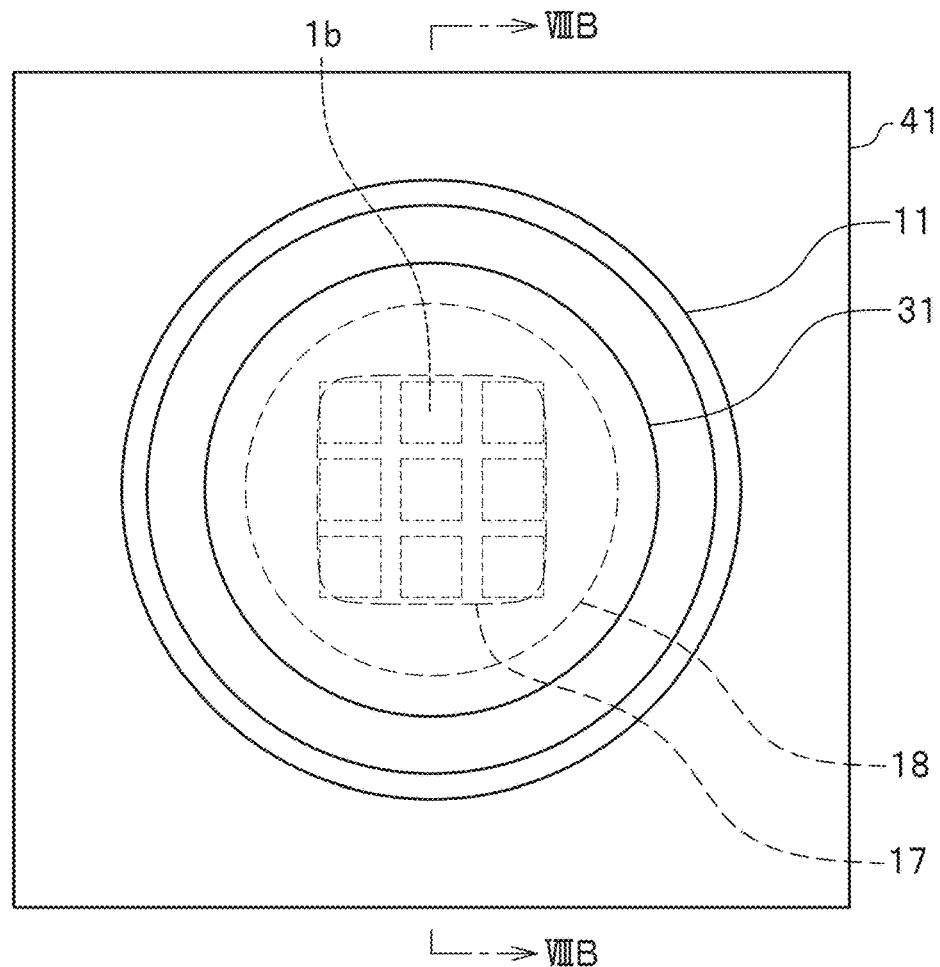
FIG. 8A is a plan view showing the positional relationship between the light emitting device 1$b$ located at one end that is lit and the first and second lenses in the light source device according to the first embodiment, in which no housing is shown, when viewed from the second lens side.
Figure 8B:
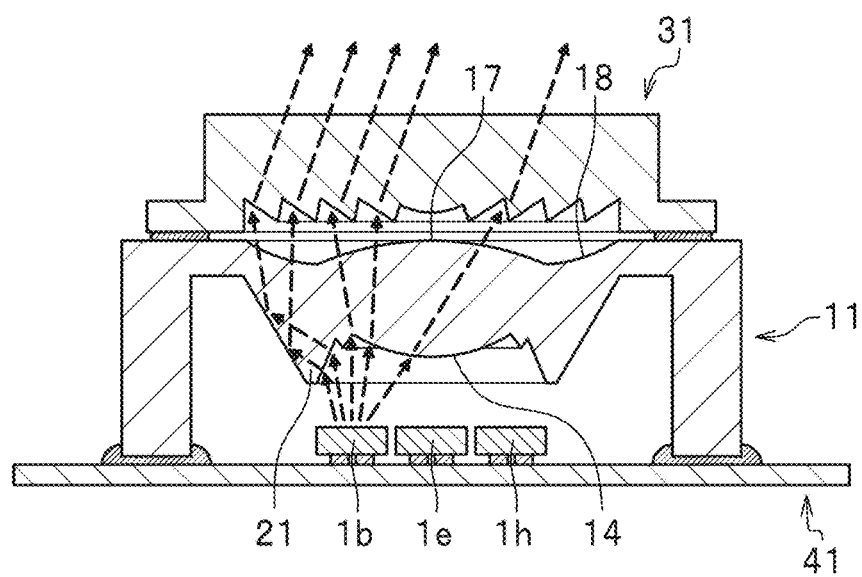
FIG. 8B is a cross-sectional view schematically showing the light paths of a light source device shown in FIG. 8A.
Figure 8C:
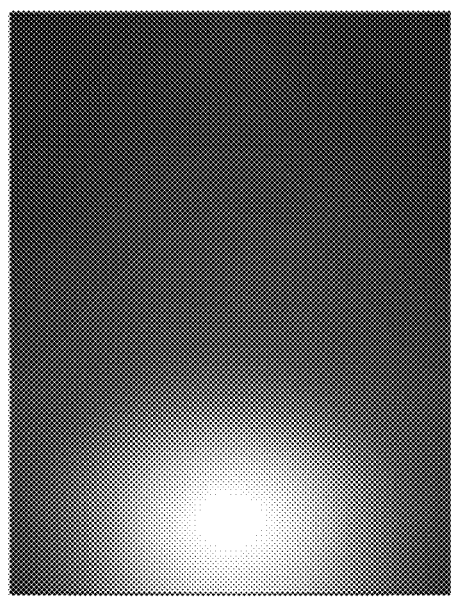
FIG. 8C is a schematic diagram showing the illuminance distribution in the light source device shown in FIG. 8B.
Figure 9A:
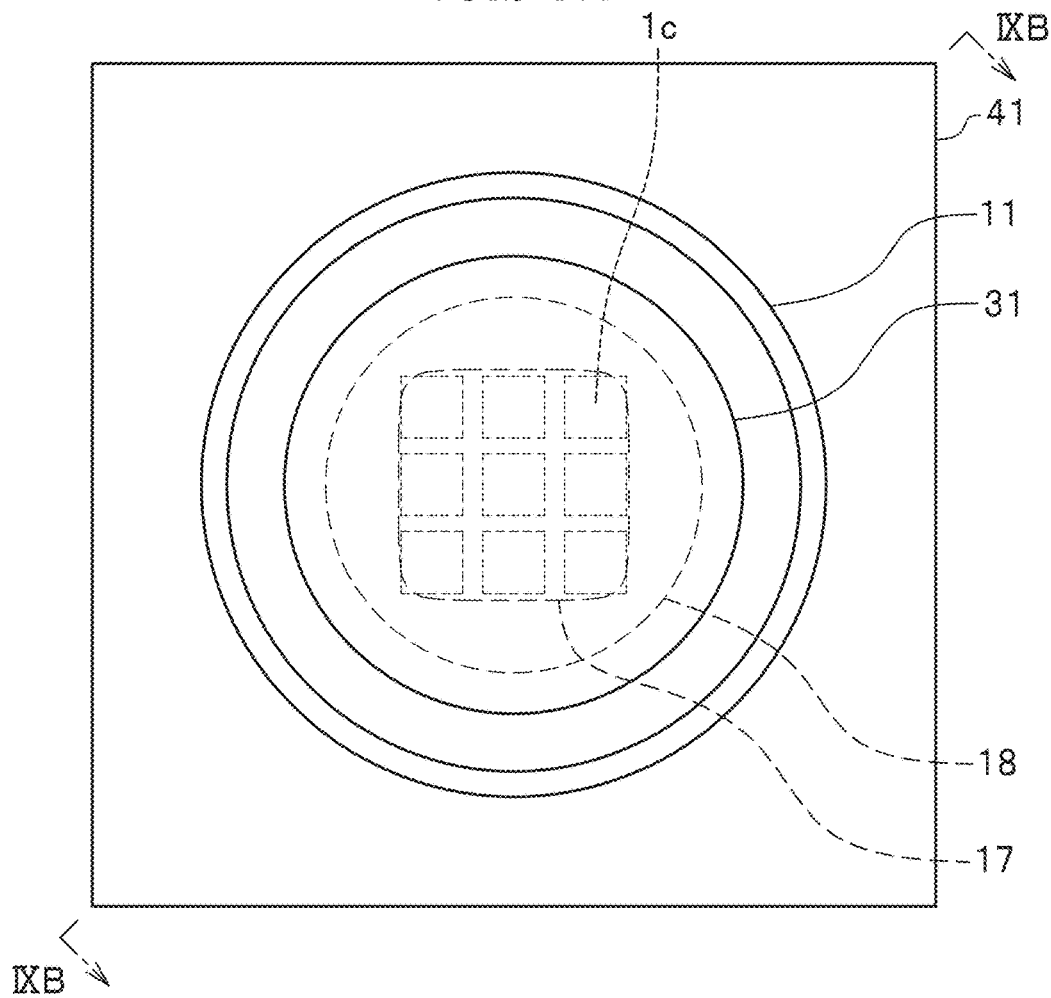
FIG. 9A is a plan view showing the positional relationship between the emitting device 1$c$ located at one corner that is lit and the first and second lenses in the light source device according to the first embodiment, in which no housing is shown, when viewed from the second lens side.
Figure 9B:
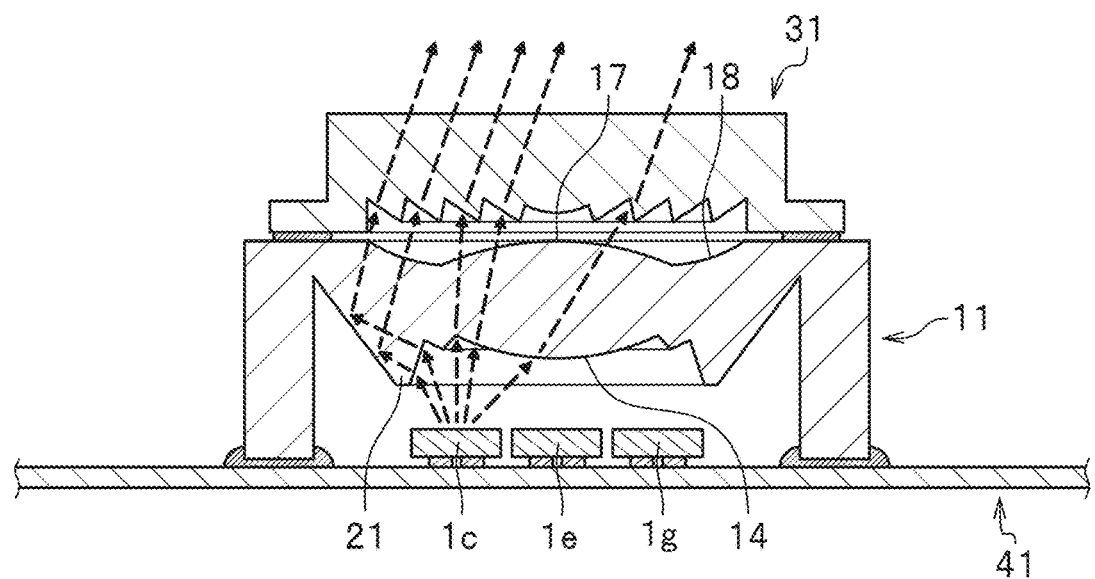
FIG. 9B is a cross-sectional view schematically showing the light paths of the light source device shown in FIG. 9A.
Figure 9C:
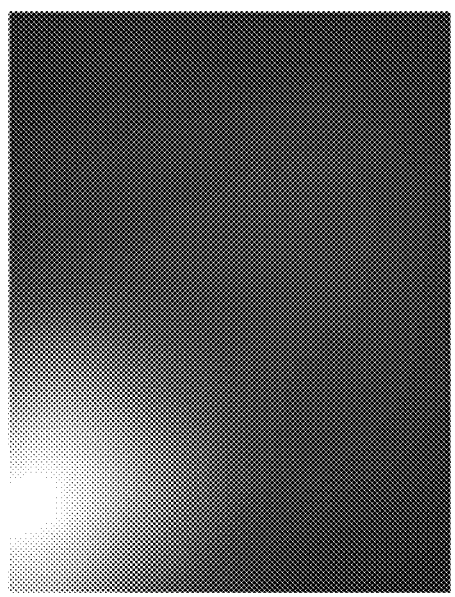
FIG. 9C is a schematic diagram showing the illuminance distribution in the light source device shown in FIG. 9B.

For example, as shown in FIG. 7A, when the light emitting device 1e located in the center of the quadrangle arrangement of the light emitting devices in a plan view is lit, the light transmitting primarily through the lower face convex portion 14 of the first lens 11 is refracted by the upper face convex portion 17 and the second lens 31 to irradiate the center of the quadrangle of a predetermined irradiation range as shown in FIG. 7B. FIG. 7C shows the illuminance distribution when the light emitting element located in the center of the quadrangle is lit. As shown in FIG. 8A, when the light emitting device 1b located at one end, excluding corners, of the quadrangle arrangement of the light emitting devices is lit, the light transmitting primarily through the lower face convex portion 14 and the light guide portion 21 of the first lens 11 is refracted by the upper face convex portion 17, the upper face concave portion 18, and the second lens 31 to irradiate an end of the quadrangle excluding corners of a predetermined irradiation range as shown in FIG. 8B. FIG. 8C shows the illuminance distribution when the light emitting element located at an end of the quadrangle excluding corners is lit. As shown in FIG. 9A, the light emitting device 1c located at a corner of the quadrangle arrangement of the light emitting devices is lit, the light transmitting primarily through the lower face convex portion 14 and the light guide portion 21 of the first lens 11 is refracted by the upper face convex portion 17, the upper face concave portion 18, and the second lens 31 to irradiate a corner of the quadrangle of a predetermined irradiation range as shown in FIG. 9B. FIG. 9C shows the illuminance distribution when the light emitting element located at a corner of the quadrangle is lit.

In the case of lighting all light emitting devices 1a to 1i, desired illuminance distribution can be produced using a limited amount of electric power by individually adjusting the outputs of the light emitting devices.

In the light source device 100, the second lens 31 disposed on the emission (top) face side includes a Fresnel lens face 32, which can make the light emitting devices 1a to 1i located in the light source device 100 less visible to thereby improve the external appearance quality.

In the case of a light source device 100, as described above, the first lens 11 is fixed to the substrate 41, and the second lens 31 having the second main body 37 inserted into the opening 52 of the housing 51 is fixed to the first lens 11 that is fixed to the substrate 41. This can reduce the device thickness H1 of the light source device 100 when used as a light source for the flashlight in a cellular phone or the like. This in turn can contribute to thickness reduction of a cellular phone.

Second Embodiment

Figure 10:
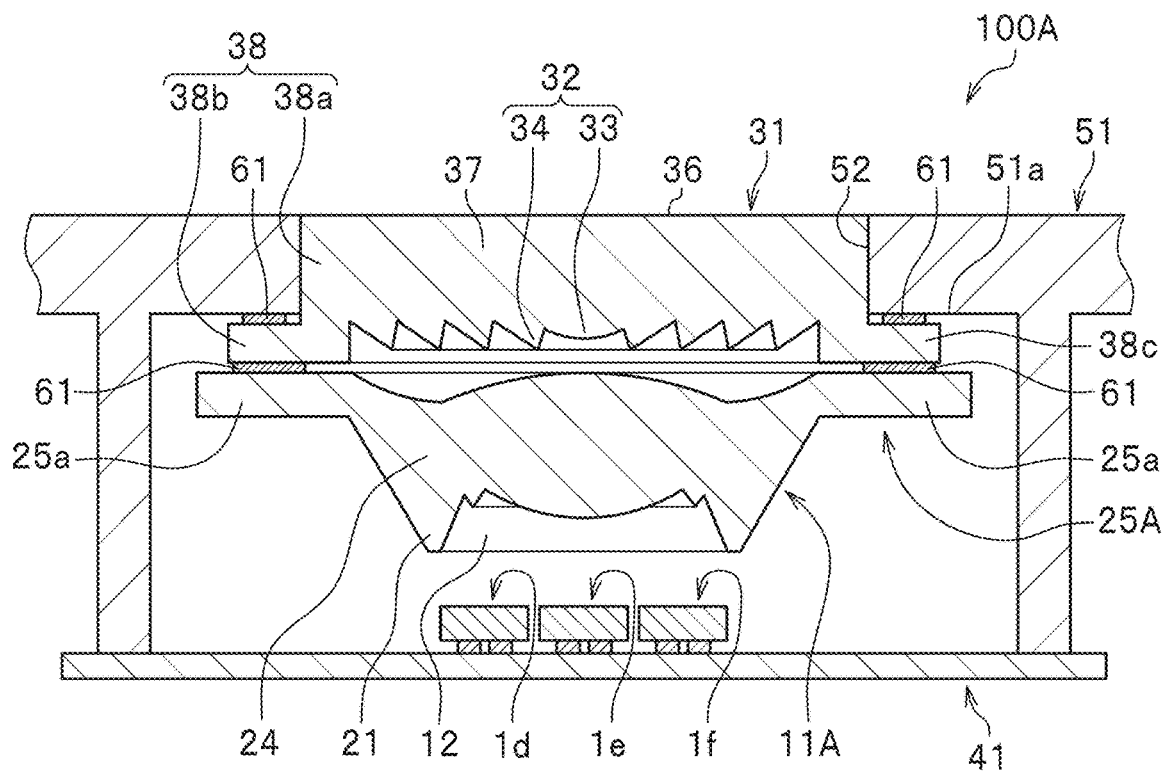
FIG. 10 is a cross-sectional view schematically showing the structure of a light source device according to a second embodiment.

FIG. 10 is a cross-sectional view schematically showing the structure of a light source device according to a second embodiment.

The light source device 100A according to the second embodiment includes features that are identical to those of the light source device 100 according to the first embodiment except that the second lens 31 is fixed to the housing 51 and the first marginal part 25 of the first lens 11A is substantially composed only of a first upper portion 25a. The differences from the light source device 100 will primarily be explained below while omitting the identical features as appropriate.

The light source device 100A includes a substrate 41 on which a plurality of light emitting devices 1a to 1i are mounted, a housing 51 defining the opening 52 that faces a second lens 31, and a first lens 11A disposed to face the second lens 31. The first lens 11A includes a first main body 24, which has an entrance part 12 and a light guide part 21, and a first marginal part 25A extending laterally from the periphery of the first main body 24. The first marginal part 25A has a first upper portion 25a. The first lens 11A is disposed spaced apart from the substrate 41 while connecting the first upper portion 25a to the second attaching portion 38b of the second lens 31 via an adhesive material 61. This can improve manufacturing efficiency because the first lens 11A and the second lens 31 are bonded together when being attached to the housing 51. The optical axes of the first lens 11A and the second lens 31 can be aligned before being attached to the housing 51, making it easy to adjust the relative positions and reduce misalignment between the optical axis of the first lens 11A and the optical axis of the second lens 31. This can also reduce the appearance quality degradation attributable to misaligned lenses.

Third Embodiment

Figure 11:
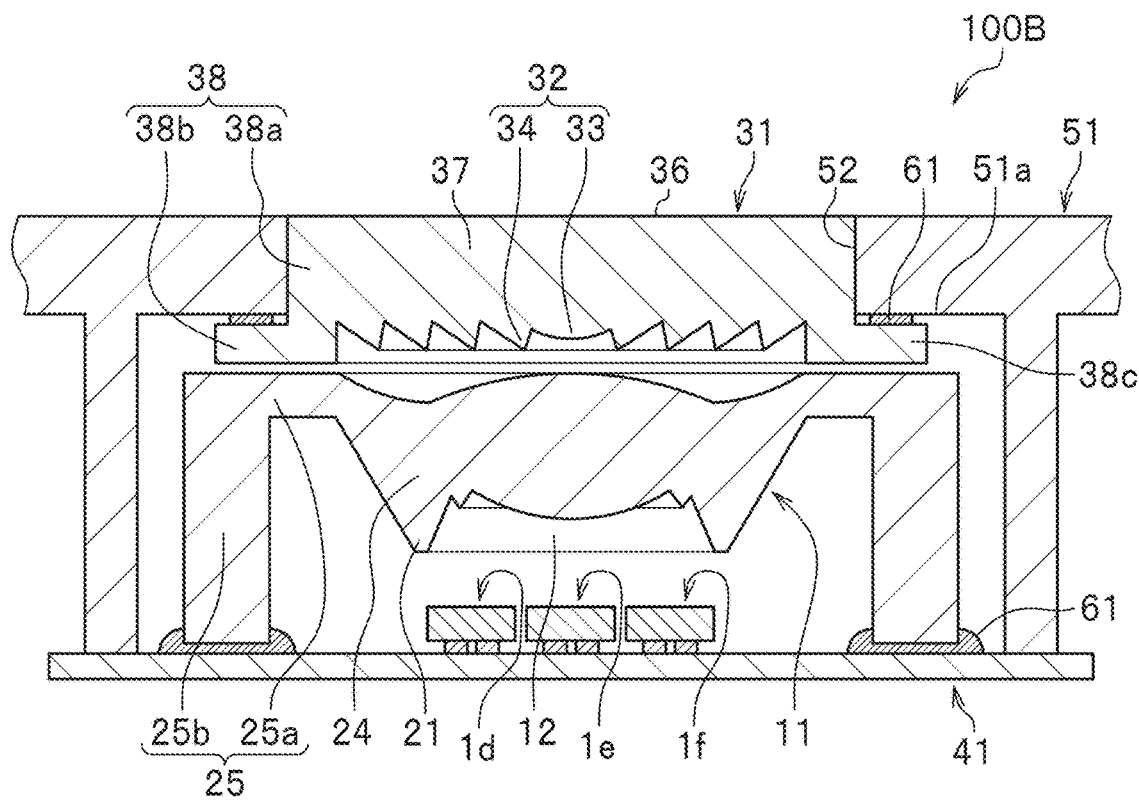
FIG. 11 is a cross-sectional view schematically showing the structure of a light source device according to a third embodiment.

FIG. 11 is a cross-sectional view schematically showing the structure of a light source device according to a third embodiment.

The light source device 100B according to the third embodiment includes features that are identical to those of the light source device 100 according to the first embodiment except that the first lens 11 is fixed to the substrate 41 and the second lens 31 is fixed to the housing 51, i.e., the first lens 11 and the second lens 31 are not fixed to one another.

The light source device 100B has the upper face of the second attaching portion 38b of the second lens 31 attached to the housing lower face 51a via an adhesive material 61, while attaching the lower face of the first leg portion 25b of the first lens 11 to the substrate 41 via an adhesive material 61. Attaching the first lens 11 to the substrate 41, and the second lens 31 to the housing 51, in this manner can increase the flexibility in the manufacturing operations for the light source device 100B.

Fourth Embodiment

Figure 12:
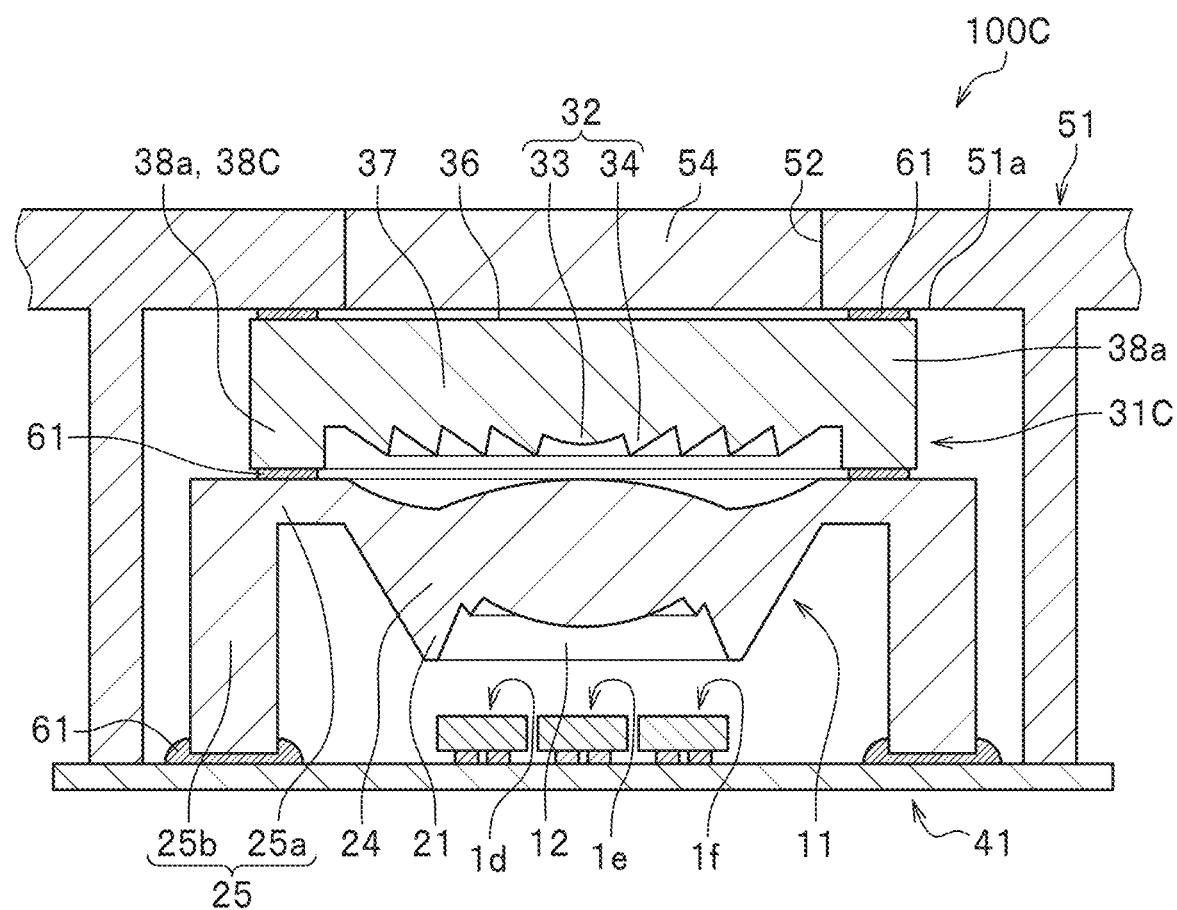
FIG. 12 is a cross-sectional view schematically showing the structure of a light source device according to a fourth embodiment.

FIG. 12 is a cross-sectional view schematically showing the structure of a light source device according to a fourth embodiment.

The light source device 100C according to the fourth embodiment includes the features that are identical to those of the light source device 100 according to the first embodiment except that a transparent member 54 is incorporated in the opening 52 of the housing 51 and the second marginal part 38C of the second lens 31C is substantially composed only of a second leg portion 38a. The transparent member 54 is preferably formed of glass, transparent resin, or the like.

The light source device 100C includes a substrate 41 on which a plurality of light emitting devices 1a to 1i are mounted, a housing 51 having an opening 52, a first lens 11, and a second lens 31C, where a transparent member 54 is incorporated in the opening 52. The light source device 100C is such that the center of the first lens 11 and the center of the second lens 31 are positioned at the center of the transparent member 54. The second lens 31C includes a Fresnel lens face 32, a second main body 37 having a flat face 36 on the opposite side to the Fresnel lens face 32, and a second marginal part 38C extending laterally from the periphery of the second main body 37.

A second leg portion 38a extending laterally from the periphery of the second main body 37 is included as the second marginal part 38C. The second leg portion 38a is formed such that the lower end face is positioned lower than the Fresnel lens face 32. The second leg portion 38a is formed into a tubular shape along the outer periphery of the second main body 37. The second leg portion 38a is formed such that its lower end face faces the first upper portion 25a of the first lens 11.

The second lens 31C is connected to the housing 51 by bonding the upper face of the second leg portion 38a and the housing lower face 51a via an adhesive material 61, and to the first lens 11 by bonding the lower end face of the second leg portion 38a and the first upper portion 25a of the first lens 11 via an adhesive material 61. The first lens 11 is fixed to the substrate 41 by bonding the upper face of the substrate 41 and the lower face of the first leg portion 25b via an adhesive material 61.

The light source device 100C provided with a transparent member 54 as a protective member does not expose the flat face 36 of the second lens 31 from the housing 51, thereby reducing degradation. When the light source device 100C is used as a light source for the flashlight of a cellular phone, the light emitting devices 1a to 1i are less visible from the outside because the transparent member 54, the second lens 31, and the first lens 11 are interposed, which can improve the external appearance quality. In the light source device 100C, the parts are bonded using an adhesive material 61 at a number of locations. Thus, dislocations of components attributable to shocks can be suppressed.

Fifth Embodiment

Figure 13:
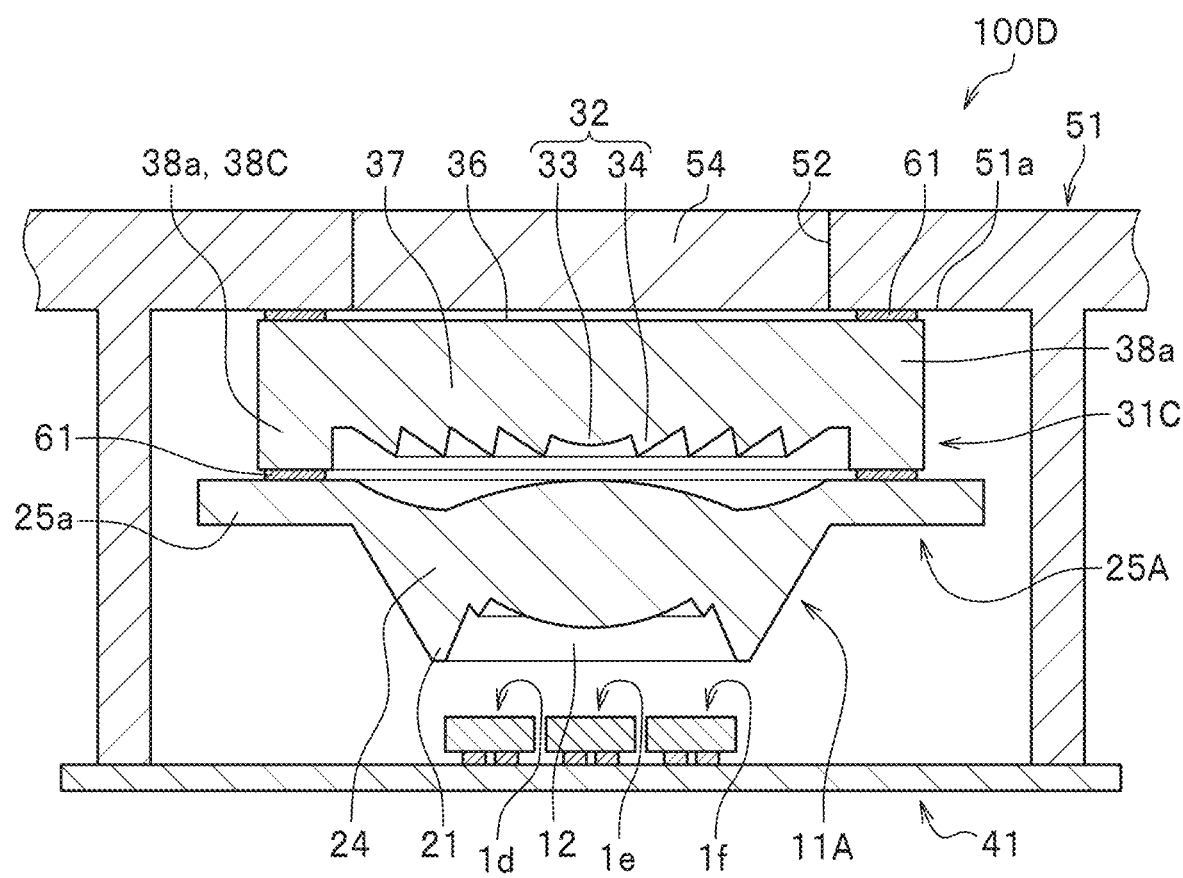
FIG. 13 is a cross-sectional view schematically showing the structure of a light source device according to a fifth embodiment.

FIG. 13 is a cross-sectional view schematically showing the structure of a light source device 100D according to a fifth embodiment.

The light source device 100D according to the fifth embodiment includes features that are identical to those of the light source device 100C according to the fourth embodiment except that the second lens 31C is fixed to the housing 51, and the first marginal part 25A of the first lens 11A is substantially composed only of a first upper portion 25a.

The light source device 100D includes a substrate 41 on which a plurality of light emitting devices 1a to 1i are mounted, a housing 51 defining an opening 52 that faces a second lens 31C, a first lens 11A disposed to face the second lens 31C, where a transparent member 54 is incorporated in the opening 52. The first lens 11A includes a first main body 24, which has an entrance part 12 and a light guide part 21, and a first marginal part 25A extending laterally from the periphery of the first main body 24. The first marginal part 25A is substantially formed only of a first upper portion 25a. Furthermore, the second lens 31C has a Fresnel lens face 32, a second main body 37 having a flat face 36 on the opposite side to the Fresnel lens face 32, and a second marginal part 38C extending laterally from the periphery of the second main body 37. The second marginal part 38C includes a second leg portion 38a extending laterally from the periphery of the second main body 37.

Moreover, the second lens 31C is fixed to the housing 51 by bonding the upper face of the second leg portion 38a and the housing lower face 51a in the periphery of the opening 52 via an adhesive material 61 such that the flat face 36 of the second main body 37 faces the transparent member 54. The second lens 31C is also fixed to the first lens 11A by bonding the lower face of the second leg portion 38a of the second marginal part 38C and the upper face of the first upper portion 25a of the first marginal part 25A via an adhesive material 61. The first lens 11A and the second lens 31C are preferably arranged such that the center of the transparent member 54, the optical axis of the first lens 11A, and the optical axis of the second lens 31C are aligned.

In the case of a light source device 100D, the first lens 11A and the second lens 31C are bonded together by an adhesive material 61 before being attached to the housing lower face 51a of the housing 51 to face the transparent member 54, which can increase the work efficiency.

Furthermore, the relative positions of the first lens 11A and the second lens 31C can be easily adjusted in conformance with the position of the opening 52 to thereby reduce misalignment with the opening 52 and degradation of the external appearance quality attributable to misalignment.

Sixth Embodiment

Figure 14:
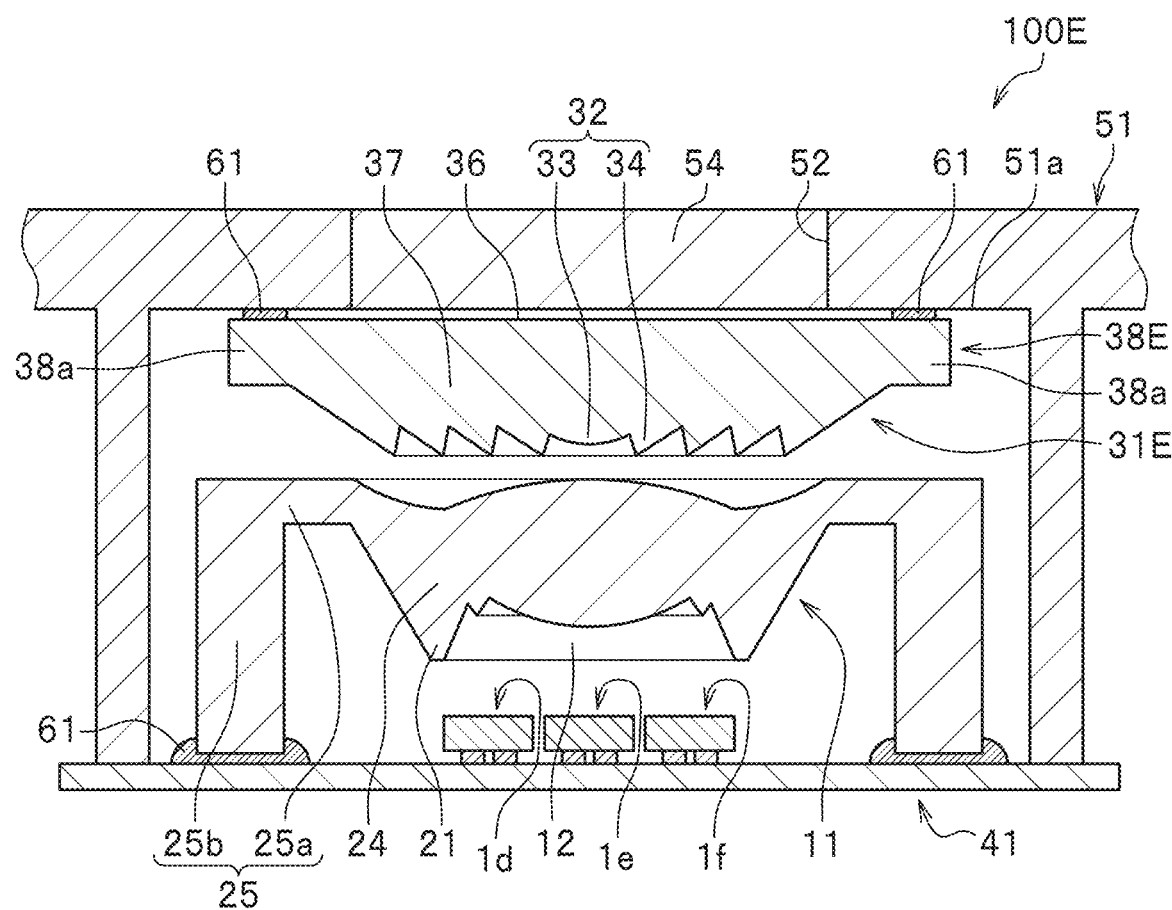
FIG. 14 is a cross-sectional view schematically showing the structure of a light source device according to a sixth embodiment.

FIG. 14 is a cross-sectional view schematically showing the structure of a light source device 100E according to a sixth embodiment.

The light source device 100E according to the sixth embodiment includes features that are identical to those of the light source device 100C according to the fourth embodiment except that the first lens 11 is fixed to the substrate 41, the second lens 31E is fixed to the housing 51, the second marginal part 38E of the second lens 31 is substantially composed only of a second leg portion 38a, and the locations bonded by an adhesive material 61 are different.

The light source device 100E includes a substrate 41 on which a plurality of light emitting devices 1a to 1i are mounted, a housing 51 defining an opening 52 that faces the second lens 31E, and a first lens 11 disposed to face the second lens 31E, where a transparent member 54 is incorporated in the opening 52. The first lens 11 includes a first main body 24, which has an entrance part 12 and a light guide part 21, and a first marginal part 25 extending laterally from the periphery of the first main body 24. The first marginal part 25 includes a first upper portion 25a extending laterally from the periphery of the first main body 24 and a first leg portion 25b extending from the first upper portion 25a towards the substrate 41.

The second lens 31E has a Fresnel lens face 32, a second main body 37 having a flat face 36 on the opposite side to the Fresnel lens face 32, and a second marginal part 38 extending laterally from the periphery of the second main body 37. The second lens 31E is disposed such that the flat face 36 of the second main body 37 faces the transparent member 54. In the second marginal part 38E, the lower face of the second leg portion 38a is positioned higher than the Fresnel lens face 32. The second leg part 38a is formed to laterally extend from the periphery of the second main body 37 and have a predetermined thickness. The second lens 31E is fixed to the housing by bonding the housing lower face 51a in the periphery of the opening 52 and the upper face of the second leg portion 38a via an adhesive material 61. The lower face of the second leg portion 38a may be positioned lower than the Fresnel lens face 32 in order to protect the Fresnel lens face 32.

The first lens 11 is fixed to the substrate 41 by bonding the upper face of the substrate 41 and the lower face of the first leg portion 25b via an adhesive material 61. The second lens 31E is connected to the housing lower face 51a via an adhesive material 61 so as to have a predetermined amount of space from the first lens 11. The first lens 11 and the second lens 31E are preferably disposed such that their optical axis centers are aligned with the center of the transparent member 54.

In the case of a light source device 100E, because the first lens 11 is attached to the substrate 41 while the second lens 31E is attached to the housing 51, the first lens 11 and the second lens 31E can easily be replaced independently. With the second lens 31E attached to the housing 51, the second lens 31E and the housing 51 in the light source device 100E can be easily aligned with one another, improving the external appearance quality attributable to misalignment.

Seventh Embodiment

Figure 15:
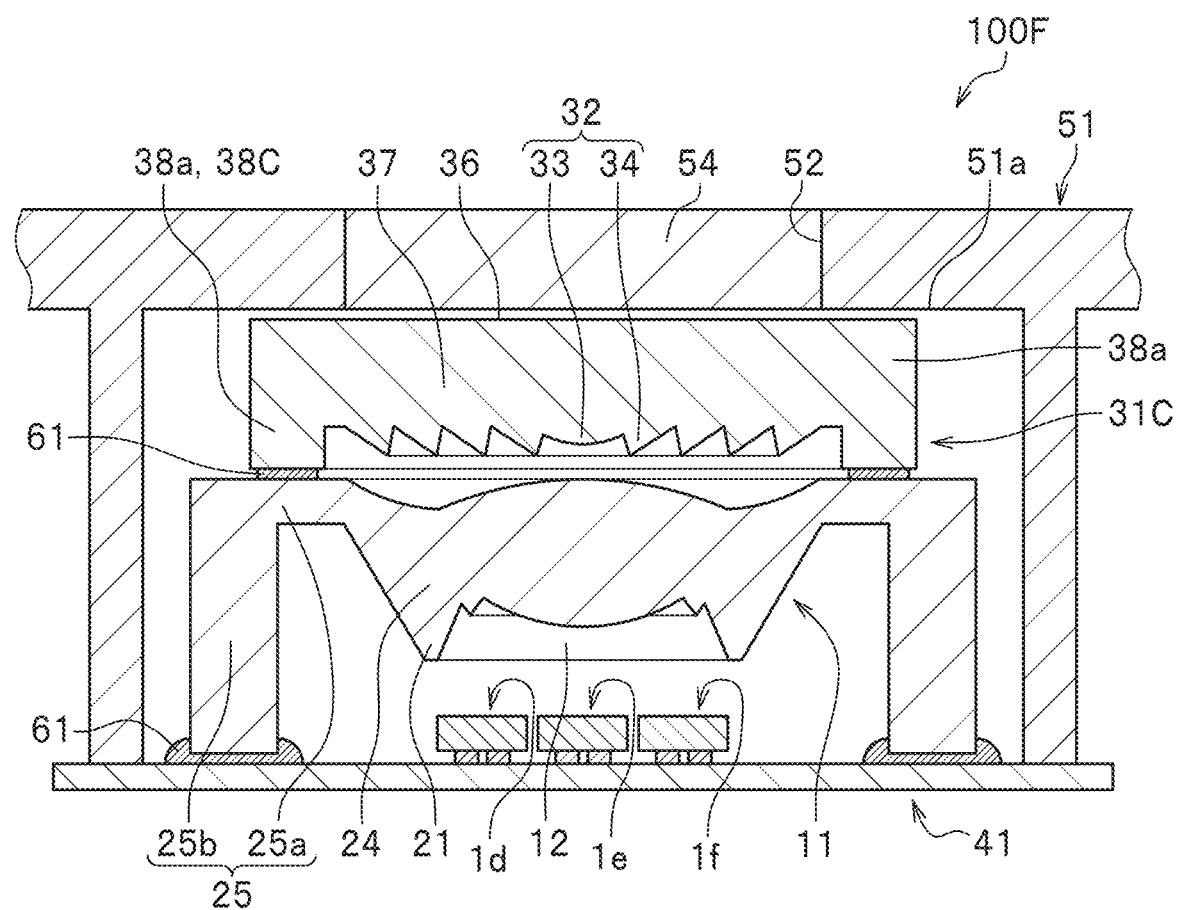
FIG. 15 is a cross-sectional view schematically showing the structure of a light source device according to a seventh embodiment.

FIG. 15 is a cross-sectional view schematically showing the structure of a light source device 100F according to a seventh embodiment.

The light source device 100F according to the seventh embodiment includes features identical to those of the light source device 100C according to the fourth embodiment except that the second lens 31C, which is fixed to the first lens 11 that is fixed to the substrate 41, is not fixed to the housing 51.

Because the second lens 31C, which is fixed to the first lens 11, is not fixed to the housing 51 in the light source device 100F, the first lens 11 and the second lens 31C can be simultaneously replaced. Moreover, in the case of a light source device 100F, the second lens 31C can be fixed to the first lens 11 after fixing the first lens 11 to the substrate 41. In other words, the second lens 31C can be disposed after positioning the first lens 11 in conformance with the position of a light emitting device 1. This can reduce the degradation of optical characteristics and external appearance quality attributable to misalignment between the optical axis of a light emitting device 1 and the centers of the lenses.

Eight Embodiment

Figure 16:
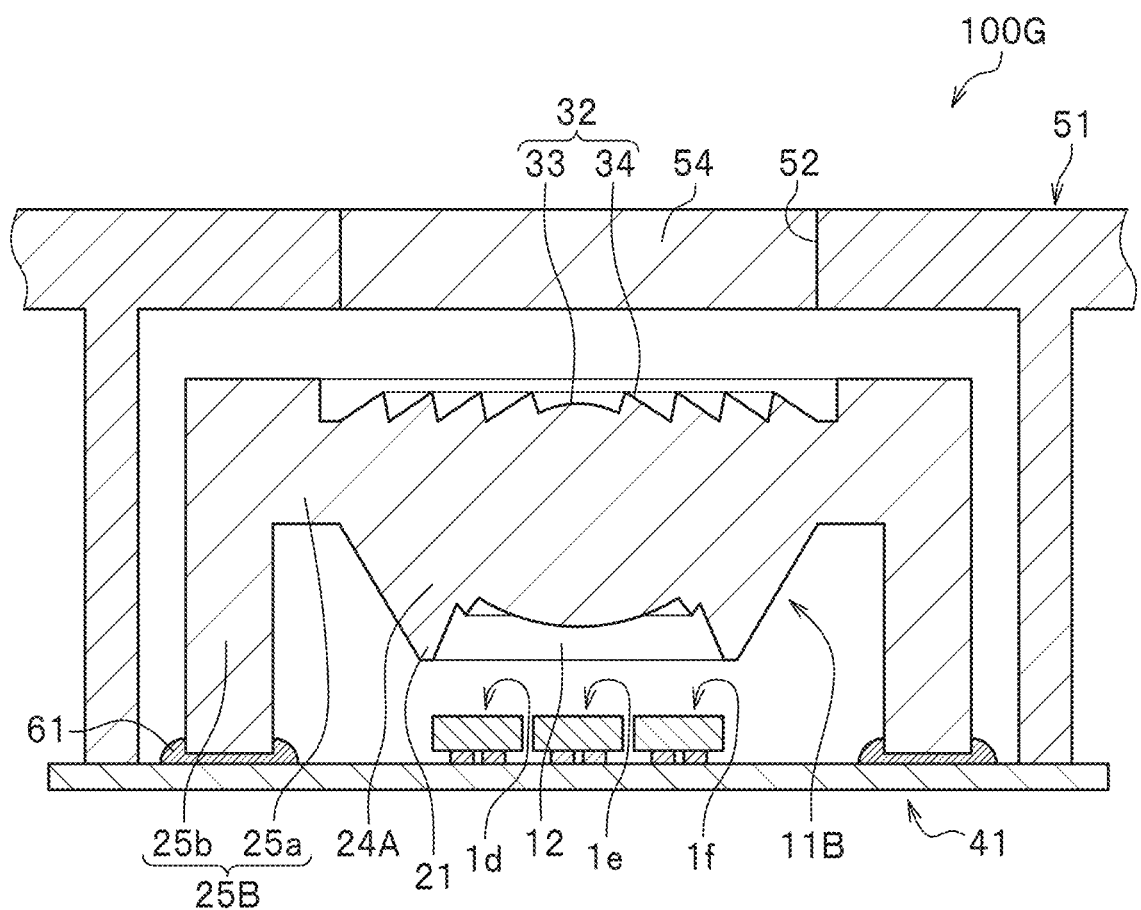
FIG. 16 is a cross-sectional view schematically showing the structure of a light source device according to an eighth embodiment.

FIG. 16 is a cross-sectional view schematically showing the structure of a light source device 100G according to an eighth embodiment.

The light source device 100G according to the eighth embodiment includes features identical to those of the light source device 100F according to the seventh embodiment except that no second lens 31C is provided, and the upper face of the first lens 11B fixed to the substrate 41 constitutes a Fresnel lens face 32. The Fresnel lens face 32 in the light source device 100G includes a central convex portion 33 protruding towards the housing 51 side that is the emission face, and a plurality of annular protruding portions 34 concentrically arranged around the shape of the central convex portion 33 and protruding towards the housing 51 side. Furthermore, the light source device 100G having a Fresnel lens face 32 of the first lens 11B can reduce the total thickness of the light source device as compared to the light source device 100F. Accordingly, when used as the light source for the flashlight of a cellular phone or the like, the smaller thickness of the light source device 100G can contribute to reducing the thickness of the cellular phone.

The first lens 11B in the light source device 100G has a lower face constituting an entrance part 12 and a light guide part 21, and an upper face constituting a Fresnel lens face 32. Accordingly, the light source device 100G can not only reduce light loss by allowing the lower face of the first lens 11B to capture the light from the light emitting device 1 without loss of light, but also improve the emission efficiency and the light distribution control towards a wider angle while keeping the size of the opening 52 of the housing 51 small. Furthermore, in the case of a light source device 100G, degradation of the optical characteristics and the external appearance quality attributable to misalignment of the optical axis of the light emitting device 1 and the center of the first lens 11B can be reduced.

Ninth Embodiment

Figure 17A:
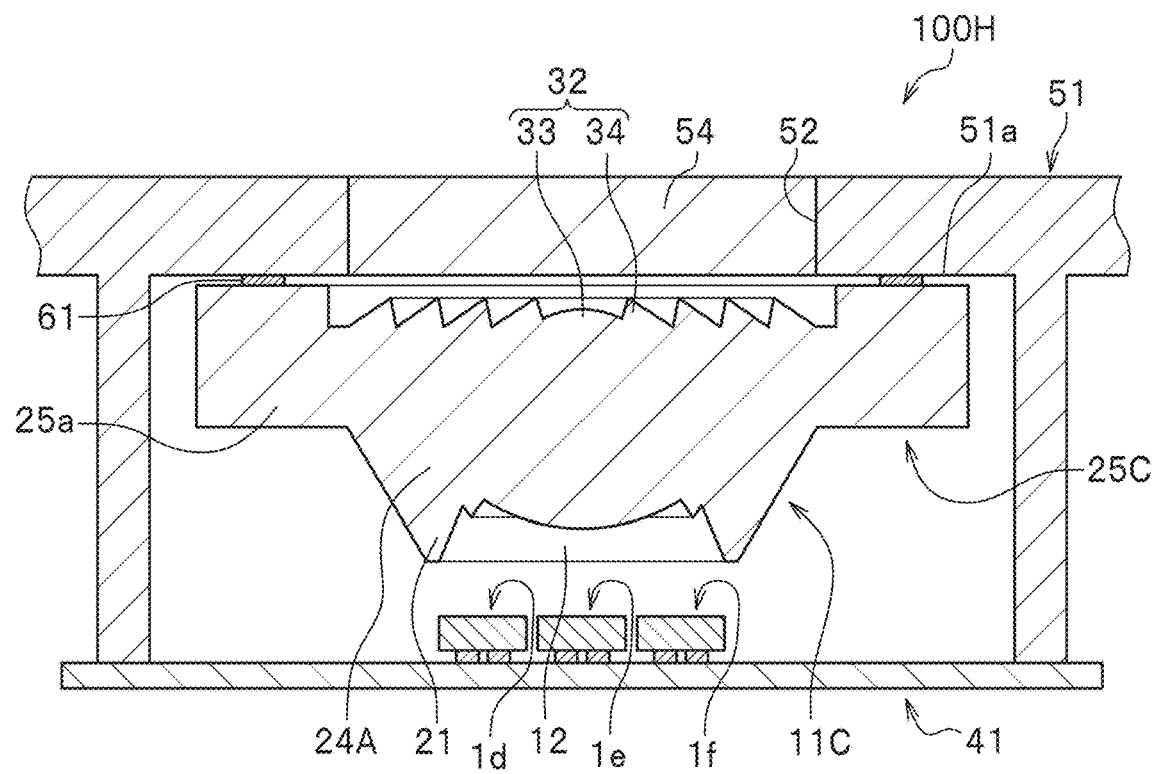
FIG. 17A is a cross-sectional view schematically showing the structure of a light source device according to a ninth embodiment.
Figure 17B:
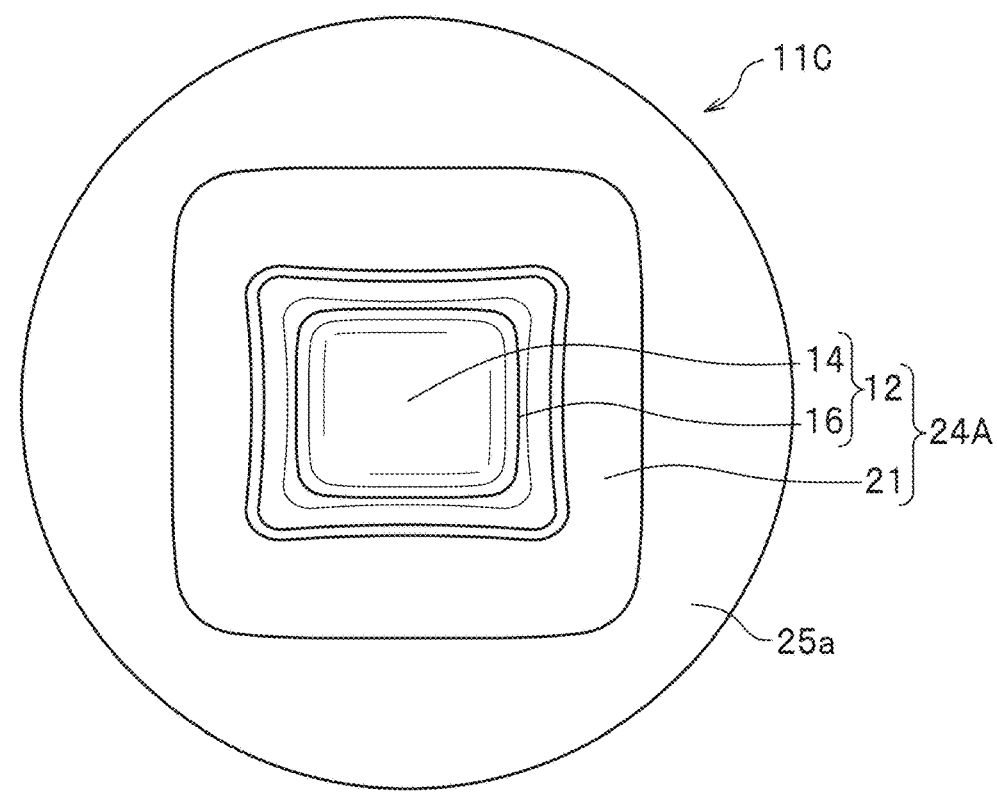
FIG. 17B is a plan view of the first lens of the light source device according to the ninth embodiment when viewed from the light emitting device side.

FIG. 17A is a cross-sectional view schematically showing the structure of a light source device 100H according to a ninth embodiment. FIG. 17B is a plan view of the first lens 11C of the light source device 100H according to the ninth embodiment when viewed from the light emitting device side.

The light source device 100H according to the ninth embodiment includes features identical to those of the light source device 100D according to the fifth embodiment except that no second lens 31C is provided, the upper face of the first lens 11C fixed to the housing 51 constitutes a Fresnel lens face 32, and the lower face of the first lens 11C is shaped to have two-fold rotational symmetry in a plan view that is more complex than four-fold rotational symmetry.

The Fresnel lens face 32 in the light source device 100H includes a central convex portion 33 protruding towards the housing 51 side that is the emission face, and a plurality of annular protruding portions 34 concentrically arranged along the shape of the central convex portion 33 and protruding towards the housing 51. Furthermore, the light source device 100H having a Fresnel lens face 32 of the first lens 11C can reduce the total thickness of the light source device as compared to the light source device 100D. Accordingly, when used as a light source for the flashlight in a cellular phone or the like, the smaller thickness of the light source device 100H can contribute to reducing the thickness of the cellular phone.

In this embodiment, as shown in FIG. 17B, the lower face of the first lens 11C is shaped to have two-fold rotational symmetry in a plan view. In the case of utilizing the light source device of this embodiment as the light source for the flashlight of a camera, considering the field of view of an image captured by the camera has a rectangular shape, such as 16:9, 4:3, or the like, the lower face of the first lens 11C is preferably shaped to have two-fold rotational symmetry in a plan view. The lower face of the first lens 11C may be shaped to have four-fold rotational symmetry in a plan view.

In the case of a light source device 100H, the position of the first lens 11C can be easily adjusted in conformance with the opening 52, which can reduce misalignment with the opening 52 to thereby reduce the degradation of the external appearance quality.

Example

The optical simulations performed using a virtual model of a light source device in one Example will be explained below. Light source devices are not limited to one described below.

Figure 18A:
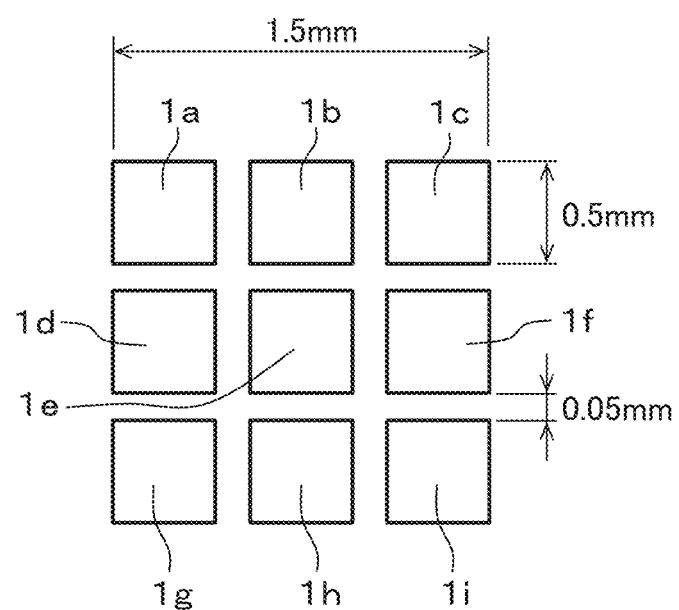
FIG. 18A is a schematic diagram showing a light source device in one example in which all nine light emitting devices 1$a$ to 1$i$ are lit.
Figure 18B:
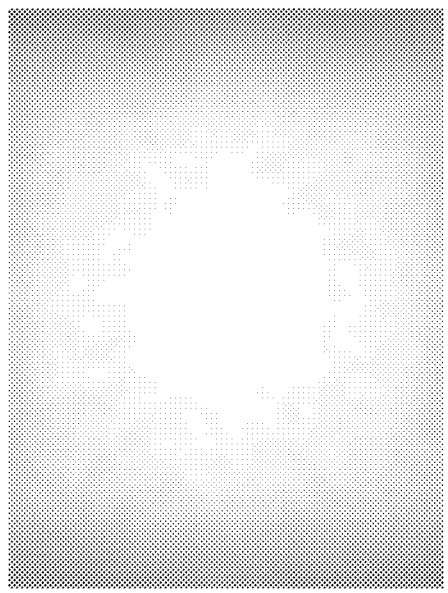
FIG. 18B is a schematic diagram showing the illuminance distribution of the light source device shown in FIG. 18A.
Figure 19A:
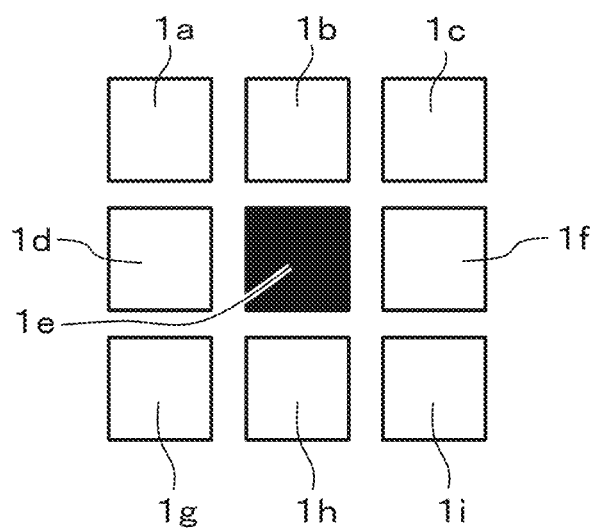
FIG. 19A is a schematic diagram showing the light source device in the example in which eight light emitting devices 1a to 1d and 1f to 1i among the nine light emitting devices 1a to 1i are lit.
Figure 19B:
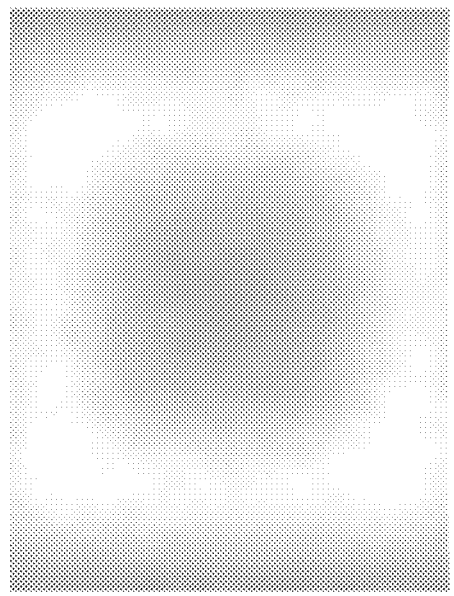
FIG. 19B is a schematic diagram showing the illuminance distribution of the light source device shown in FIG. 19A.
Figure 20A:
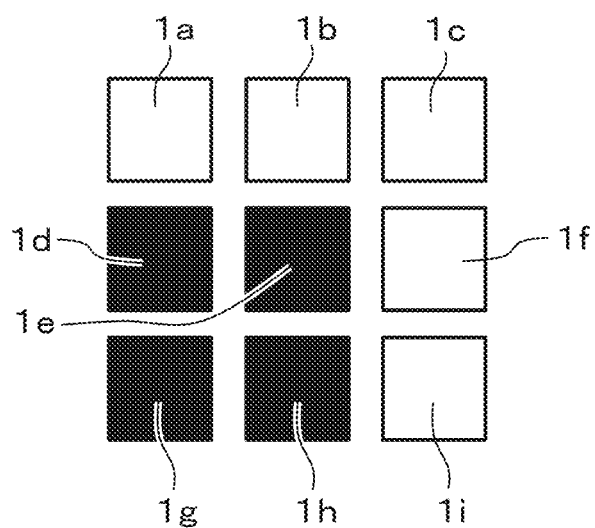
FIG. 20A is a schematic diagram showing the light source device in the example in which five light emitting devices 1a to 1c, 1f and 1i among the nine light emitting devices 1a to 1i are lit.
Figure 20B:
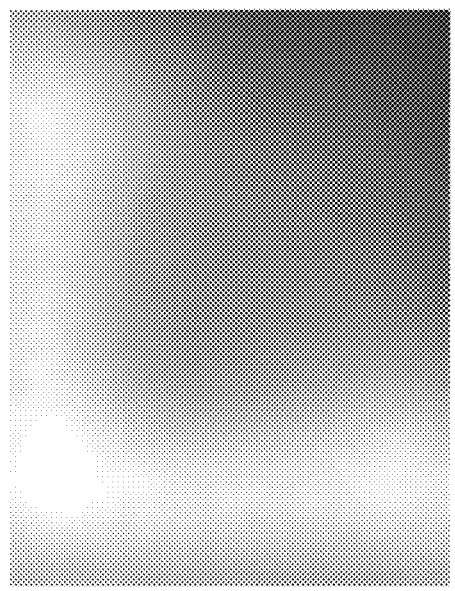
FIG. 20B is a schematic diagram showing the illuminance distribution of the light source device shown in FIG. 20A.

FIG. 18A is a schematic diagram of a lit/unlit state of the light emitting devices in the light source device in the Example showing all nine light emitting devices 1a to 1i are lit. FIG. 18B is a schematic diagram showing the illuminance distribution of the light source device in FIG. 18A. FIG. 19A is a schematic diagram showing a lit/unlit state of the light emitting devices in the light source device in the Example showing eight light emitting devices 1a to 1d and 1f to 1i among the nine light emitting devices 1a to 1i are lit. FIG. 19B is a schematic diagram showing the illuminance distribution of the light source device in FIG. 19A. FIG. 20A is a schematic diagram of a lit/unlit state of the light emitting devices in the light source device in the Example showing five light emitting devices 1a to 1c, 1f and 1i among the nine light emitting devices 1a to 1i are lit. FIG. 20B is a schematic diagram showing the illuminance distribution of the light source device in FIG. 20A. In FIG. 18A, FIG. 19A, and FIG. 20, the lit state and the unlit state of the light emitting devices are simply indicated using white and black, respectively.

Based on the structure of the light source device 100 of the embodiment shown in FIG. 1, irradiation of the light from the light emitting devices 1a to 1i through the first lens 11 and the second lens 31 was simulated.

In the virtual model of the light source device 100 in the Example, the emission face of each light emitting device was a 0.5 mm square. The light emitting devices 1a to 1i were arranged in a quadrangle using the coordinates listed below by using, as the origin of the coordinates, the center of the emission face of the light emitting device 1e located in the center of the nine light emitting devices 1a to 1i. The coordinates below are in millimeters.

The center of the emission face of the light emitting device 1a: (−0.55, 0.55)

The center of the emission face of the light emitting device 1b: (0, 0.55)

The center of the emission face of the light emitting device 1c: (0.55, 0.55)

The center of the emission face of the light emitting device 1d: (−0.55, 0)

The center of the emission face of the light emitting device 1e: (0, 0)

The center of the emission face of the light emitting device 1f: (0.55, 0)

The center of the emission face of the light emitting device 1g: (−0.55, −0.55)

The center of the emission face of the light emitting device 1h: (0, −0.55)

The center of the emission face of the light emitting device 1i: (0.55, −0.55)

In the light source device 100 in the Example, as shown in FIG. 1 and FIG. 5, the first lens 11 includes, in the lower face, an entrance part 12 that includes a lower face convex portion 14 with a square shape having a 0.57 mm side in a plan view in the lower face center and a 0.19 mm wide square annular angular portion 16 contiguous with the periphery of the lower face convex portion 14, and a 0.49 mm wide square annular light guide part 21 contiguous with the periphery of the angular portion 16. The first lens 11 includes, in the upper face, an upper face convex portion 17 with a square shape having a 0.71 mm side in a plan view in the upper face center, and a 1.3 mm wide square annular flat portion 19 via an upper face concave portion 18 contiguous with the upper face convex portion 17.

In the light source device 100 in the Example the second lens 31 includes a Fresnel lens face 32 in the lower face as shown in FIG. 6. The second lens 31 includes a central convex portion 33 having a 0.45 mm radius circular shape in a plan view in the center of the Fresnel lens face 32, a protruding portion 34 concentrically formed and having a peak at the 1.5 mm radius that is the furthest position from the center of the Fresnel lens face, and a plurality of protruding portions 34 concentrically provided at equal intervals between the furthest protruding portion 34 and the central convex portion 33. The second lens 31 includes, in the upper face, a flat face 36 having a 1.77 mm radius circular shape in a plan view. The light source device 100 in this Example was provided with four protruding portions 34.

Using the virtual model of the light source device 100 in the Example, the illuminance distributions were measured by simulation by lighting all or certain lighting devices 1a to 1i under the measuring conditions listed below.

Measuring Conditions
    Size of the evaluation photoreceiver: 280×370 mm
    Distance between the light emitting devices and the evaluation photoreceiver: 300 mm
    Angle of view of the evaluation photoreceiver: 75 degrees
    Distance between the light emitting device top surfaces and the first lens: 0.1 mm As shown in FIG. 18A to FIG. 20B, it was confirmed that the light source device 100 according to the embodiment can achieve illuminance distributions in correspondence with the locations of the lit light emitting devices. It was also confirmed that when a desired irradiation range was irradiated, the source device 100 according to the embodiment was able to achieve a large illuminance difference between the inside and the outside of the irradiation range. In the case of a light source device 100, light is irradiated through the first lens 11 and the second lens 31 to thereby being irradiated in the refraction direction according to the lenses.

In the case of lighting all nine light emitting devices 1a to 1i as shown in FIG. 18A, it was also confirmed that adjusting the output of each light emitting device can create desired illuminance distribution within a limited amount of electric power. For example, in the case of requiring a flash brighter in the center, supplying more electric power to the light emitting device 1e located in the center of the quadrangle could achieve a brighter flash having a higher illuminance in the center. Moreover, in the case of uniformly irradiating a wide range, balancing the electric power supplied to each light source could achieve a uniform illuminance distribution. Normally, supplying the same amount of electric power (same brightness) to all light emitting devices 1a to 1i would result in an illuminance distribution in which the central portion of the quadrangle where the light emitting devices are concentrated is brighter while the corners or the edges of the quadrangle are less bright. It was confirmed that reducing the amount of power supplied to the light emitting device 1e located in the center of the quadrangle while increasing the amount of power supplied to the light emitting devices 1a to 1c, 1d, 1f, and 1g to 1i located at the corners and the edges of the quadrangle could achieve a more uniform illuminance distribution.

Various changes may be applied to each constituent element described in the forgoing. For example, the number of the angular portions 16 of the Fresnel lens face in the first lens may be increased, or the curvature of the Fresnel lens face may be suitably changed. Moreover, in the case where the first lens includes a TIR lens face, the inclination angles of the angular portion 16 and the oblique face may suitably be changed. Furthermore, in each of the embodiments described above, the flat face of the second lens has been described as being coplanar with the housing surface, but a protective sheet may be applied to the flat face to make the surface of the protective sheet coplanar with the housing surface.

DESCRIPTION OF REFERENCE NUMERALS 1a, 1b, 1c, 1d, 1e, 1f, 1g, 1h, 1i Light emitting device
2 Light emitting element 3 Electrode
4 Light transmissive member
5 Cover member
11, 11A, 11B, 11C First lens
12 Entrance part
14 Lower face convex portion
16 Angular portion
17 Upper face convex portion
18 Upper face concave portion
19 Flat portion
21 Light guide part
22 Inner lateral face
23 Oblique face
24, 24A First main body
25, 25A, 25B, 25C First marginal part
25a First upper portion
25b First leg portion
31, 31C, 31E Second lens
32 Fresnel lens face
33 Central convex portion
34 Protruding portion
36 Flat face
37 Second main body
38, 38C, 38E Second marginal part
38a Second leg portion
38b Second attaching portion
41 Substrate
42 Wiring
51 Housing
51a Housing loser face
52 Opening
53 Leg portion
54 Transparent member
61 Adhesive material
62 Conductive adhesive material
100, 100A, 100B, 100C, 100D, 100E, 100F, 100G, 100H Light emitting device

What is claimed is:

1. A light source device comprising:
   a substrate;
   a housing defining an opening;
   a plurality of independently operable light emitting devices mounted on the substrate;
   a first lens fixed to the substrate and facing the light emitting devices, the first lens comprising:
      a first main body having a lower face that faces the light emitting devices and comprises:
         an entrance part located in a center of the lower face where light from the light emitting devices enters, and
         a light guide part located outward of the entrance part and configured to guide light entering the entrance part, and
      a first marginal part extending laterally from a periphery of the first main body; and
   a second lens located in the opening defined by the housing and facing the first lens, the second lens comprising:
      a second main body having:
         a lower face that faces the first lens and comprises a Fresnel lens face composed of a plurality of annular protruding portions, and
         a flat face located on a side opposite the Fresnel lens face, and
      a second marginal part extending laterally from a periphery of the second main body; wherein:
         an upper face of the first marginal part is fixed to a lower face of the second marginal part via an adhesive material.

2. The light source device according to claim 1, wherein the entrance part is a concave portion formed in the lower face of the first main body.

3. The light source device according to claim 2, wherein the lower face of the first main body comprises, in a bottom face of the concave portion, a lower face convex portion protruding towards the light emitting devices.

4. The light source device according to claim 1, wherein the lower face of the first lens has a 4-fold symmetrical shape in a plan view.

5. The light source device according to claim 4, wherein the lower face of the first lens has a quadrilateral shape in a plan view.

6. The light source device according to claim 1, wherein:
   an upper face of the first lens comprises:
      an upper face convex portion located in a center,
      an upper face concave portion that is contiguous with the upper face convex portion, and
      a flat portion located outward of the upper face concave portion.

7. The light source device according to claim 1, wherein the light emitting devices are collectively arranged in a quadrangle in a plan view.

8. The light source device according to claim 1, wherein: the second lens is fixed to the housing.

9. The light source device according to claim 1, wherein:
   an upper face of the first lens comprises:
      an upper face convex portion provided in a center of the upper face, and
      a flat portion located outward of the upper face convex portion.

10. A cellular phone comprising:
    a cellular phone housing; and
    the light source device according to claim 1; wherein:
       the housing of the light source device is a portion of the cellular phone housing.

11. A light source device comprising:
    a substrate;
    a housing defining an opening;
    a plurality of independently operable light emitting devices mounted on the substrate;
    a first lens facing the light emitting device, the first lens comprising:
       a first main body having a lower face that faces the light emitting device and comprises:
          an entrance part located in a center of the lower face where light from the light emitting device enters, and
          a light guide part located outward of the entrance part and configured to guide the light entering the entrance part, and
       a first marginal part extending laterally from a periphery of the first main body; and
    a second lens fixed to the housing, located in the opening defined by the housing, and facing the first lens, the second lens comprising:
       a second main body having:
          a lower face that faces the first lens and comprises a Fresnel lens face composed of a plurality of annular protruding portions, and
          a flat face provided on a side opposite the Fresnel lens face, and
       a second marginal part extending laterally from a periphery of the second main body; wherein:

an upper face of the first marginal part is fixed to a lower face of the second marginal part via an adhesive material.

12. The light source device according to claim 11, wherein the entrance part is a concave portion formed in the lower face of the first main body.

13. The light source device according to claim 12, wherein the lower face of the first main body comprises, in a bottom face of the concave portion, a lower face convex portion protruding towards the light emitting devices.

14. The light source device according to claim 11, wherein the lower face of the first lens has a 4-fold symmetrical shape in a plan view.

15. The light source device according to claim 14, wherein the lower face of the first lens has a quadrilateral shape in a plan view.

16. The light source device according to claim 11, wherein:
    an upper face of the first lens comprises:
        an upper face convex portion located in a center of the upper face,
        an upper face concave portion that is contiguous with the upper face convex portion, and
        a flat portion located outward of the upper face concave portion.

17. The light source device according to claim 11, wherein the light emitting devices are collectively arranged in a quadrangle in a plan view.

18. The light source device according to claim 11, wherein:
    an upper face of the first lens comprises:
        an upper face convex portion provided in a center of the upper face, and
        a flat portion located outward of the upper face convex portion.

19. A cellular phone comprising:
    a cellular phone housing; and
    the light source device according to claim 11; wherein:
    the housing of the light source device is a portion of the cellular phone housing.

* * * * *